(12) United States Patent
Sakamoto et al.

(10) Patent No.: US 7,005,675 B2
(45) Date of Patent: Feb. 28, 2006

(54) LIGHT-EMITTING DEVICE, METHOD FOR DRIVING LIGHT-EMITTING DEVICE AND ELEMENT BOARD

(75) Inventors: Yasuhiro Sakamoto, Hyogo (JP); Takeshi Noda, Kanagawa (JP); Kazutaka Inukai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 119 days.

(21) Appl. No.: 10/447,268

(22) Filed: May 29, 2003

(65) Prior Publication Data

US 2004/0056257 A1 Mar. 25, 2004

(30) Foreign Application Priority Data

May 31, 2002 (JP) ........................................ 2002-160318

(51) Int. Cl.
*H01L 29/04* (2006.01)

(52) U.S. Cl. ............................. 257/59; 257/72; 257/83; 257/351; 257/368

(58) Field of Classification Search .................. 257/59, 257/72, 83, 351, 368
See application file for complete search history.

(56) References Cited

U.S. PATENT DOCUMENTS

| | | | | |
|---|---|---|---|---|
| 3,898,480 A | * | 8/1975 | Spence et al. ................. | 377/75 |
| 4,917,467 A | | 4/1990 | Chen et al. | |
| 5,258,325 A | | 11/1993 | Spitzer et al. | |

(Continued)

FOREIGN PATENT DOCUMENTS

| | | |
|---|---|---|
| EP | 1 102 234 A2 | 5/2001 |
| JP | 60-241266 | 11/1985 |
| JP | 04-092475 | 3/1992 |
| JP | 04-267551 | 9/1992 |
| JP | 07-504782 | 5/1995 |
| JP | 2000-056847 | 2/2000 |
| JP | 2001-147659 | 2/2000 |
| JP | 2000-235370 | 8/2000 |
| JP | 2000-347621 | 12/2000 |
| JP | 2001-147659 | 5/2001 |
| JP | 2004-004348 | 1/2004 |

OTHER PUBLICATIONS

*Technology Digest IEDM 1998*, Dawson et al. "The Impact of the Transient Response of Organic Light Emitting Diodes on the Design of Active Matrix OLED Displays" pp. 875–878.

*Photochemical Processes in Organized Molecular Systems*, Tsutsui et al., "Electroluminescence in Organic Thin Films", pp. 437–450.

*Applied Physics Letters*, Baldo et al., "Very High–Efficiency Green Organic Light–Emitting Devices Based on Eletrophosphorescence" vol. 75, No. 1, Jul. 7, 1995, pp. 4–6.

*Primary Examiner*—Hoai Pham
*Assistant Examiner*—Wai-Sing Louie
(74) *Attorney, Agent, or Firm*—Nixon Peabody LLP; Jeffrey L. Costellia

(57) ABSTRACT

A current-input light-emitting device of the invention converts a current corresponding to a given video signal to a voltage by passing the current between two nodes of four nodes of a multi-terminal transistor, converts the voltage to a current again by shorting the other two nodes different and supplies the current to a light-emitting element. A threshold-corrected, voltage-input light-emitting device shorts two nodes of four nodes of a multi-terminal transistor to write a threshold value voltage into a storage capacitor and to write a voltage corresponding to a given video signal into the storage capacitor. Next, the other two nodes are shorted, and the voltage of the two nodes is converted to a current. Then the current is supplied to a light-emitting element.

12 Claims, 21 Drawing Sheets

U.S. PATENT DOCUMENTS

| | | | |
|---|---|---|---|
| 6,020,598 | A | 2/2000 | Yamazaki et al. |
| 6,229,506 | B1 | 5/2001 | Dawson et al. |
| 6,246,180 | B1 | 6/2001 | Nishigakle |
| 6,583,775 | B1 | 6/2003 | Sekiya et al. |
| 6,633,270 | B1 * | 10/2003 | Hashimoto .................. 345/76 |
| 2002/0047852 | A1 | 4/2002 | Inukai et al. |
| 2002/0086180 | A1 | 7/2002 | Seo et al. |
| 2003/0015960 | A1 | 1/2003 | Seo et al. |
| 2003/0066740 | A1 | 4/2003 | Inuaki |
| 2003/0089910 | A1 | 5/2003 | Inukai |
| 2003/0184505 | A1 | 10/2003 | Inukai et al. |

OTHER PUBLICATIONS

*Jpn. J. Applied Phys.*, Tetsuo et al. "High Quanturn Efficiency in Organic Light Emitting Devices with Iridium–Complex as a Triplet Emissive Center", vol. 38/Part 2/No. 12B/(1999) pp. L1502–L1504.

*Letters to Nature*, Baldo et al., "Highly Efficient Phosphorescent Emission From Organic Electroluminescent Devices", (Sep. 1998), vol. 395/pp. 151–154.

* cited by examiner

Writing Time Period (Ta)
Tr4,5 off
Tr1,2,3 on

L/W small

Holding Time Period (Th)
Tr1,2,3,4,5 off

L/W large

Display Time Period (Td)
Tr1,2,3 off
Tr4,5 on

Initializing Time Period
Tr1,2,4 off
Tr5 on
Tr3 on→off

Writing Time Period
Tr2,3,4 off
Tr1,5 on

Display Time Period
Tr1,3,5 off
Tr2,4 on

LIGHT-EMITTING DEVICE, METHOD FOR DRIVING LIGHT-EMITTING DEVICE AND ELEMENT BOARD

BACKGROUND OF THE INVENTION

1. Field of the Invention

The present invention relates to a light-emitting device including multiple pixels each having a light-emitting element and a unit for supplying a current to the light-emitting element and a method for driving the light-emitting device.

2. Description of the Related Art

Since a light-emitting element emits light by itself, the light-emitting element is highly visible and does not require a back light to be required for a liquid crystal display device. Therefore, a light-emitting element is suitable for thin devices. Furthermore, the viewing angle of a light-emitting device is not limited. Because of these advantages, a light-emitting device having a light-emitting element has recently gathered attentions as an alternative display device to a CRT and/or an LCD.

The intensity of a light-emitting element herein can be controlled by a current or a voltage. The light-emitting element includes an organic light-emitting diode (OLED) and an MIM type electron source element (electron emitting element) to be used for a field emission display (FED).

An OLED (organic light-emitting diode) is a kind of light-emitting element and includes a layer (called electric field light-emitting layer hereinafter) containing an electric field light-emitting material for obtaining electroluminescence generated by applying an electric field thereto, an anode and a cathode. The electric field light-emitting layer is provided between the anode and the cathode and further contains one or multiple layers. These layers may contain an inorganic compound. The electroluminescence in an electroluminescence layer includes light emission (fluorescence) when a singlet exciting state returns to a ground state and a light emission (phosphorescence) when a triplet exciting state to a ground state.

Next, the construction of a pixel of a general light-emitting device and the drive will be described briefly. A pixel shown in FIG. 19 has TFTs 80 and 81, a storage capacitor 82 and a light-emitting element 83.

A gate of the TFT 80 is connected to a scantine 85. One of a source or a drain of the TFT 80 is connected to a signal line 84, and the other is connected to a gate of the TFT 81. A source of the TFT 81 is connected to a terminal 86. A drain of the TFT 81 is connected to the anode of the light-emitting element 83. The cathode of the light-emitting element 83 is connected to a terminal 87. The storage capacitor 82 is provided for retaining a voltage between the gate and source of the TFT 81. Predetermined amounts of voltages are applied from a power source to the terminals 86 and 87, which have a voltage difference.

The term "voltage" herein means a potential difference from the ground unless especially mentioned.

When the TFT 80 is turned on by the voltage of the scanline 85, the voltage of a video signal input to the signal line 84 is input to the gate of the TFT 81. In accordance with the voltage of the input video signal, the gate voltage (a voltage difference between the gate and source) of the TFT 81 is determined. The gate voltage causes the drain current to flow in the TFT 81, and the drain current is supplied to the light-emitting element 83. The light-emitting element 83 emits light by using the supplied current.

A TFT containing polysilicon has a higher field effect mobility than that of a TFT containing amorphous silicon and has a large On-current. Therefore, the TFT of polysilicon can be a more suitable transistor for a light-emitting device. However, the electric characteristic of the TFT of polysilicon is still not compared with the characteristic of a MOS transistor on a single crystalline silicon substrate. For example, the field effect mobility is 1/10 of that of the single crystalline silicon or lower. The TFT of polysilicon easily has variations in characteristics due to a defect in a crystal grain boundary. This is a disadvantage.

When the characteristics such as threshold values and On-currents of the TFT 81 differ in the pixels shown in FIG. 19, the magnitude of the drain current of the TFT 81 differs among pixels even with the same voltage of video signals. As a result, the intensity of the light-emitting element 83 varies.

In order to avoid these problems, various kinds of pixel constructions have been proposed which can suppress the variation in a current flowing though the light-emitting element due to the variations in characteristics of TFTs. The constructions of a current-input pixel and a threshold-value-corrected, voltage-input pixel, which are typical pixels, will be illustrated, and the driving will be further described.

First of all, the construction of the current-input pixel disclosed in Patent Document 1 mentioned below will be described with reference to FIG. 20A.

[Patent Document 1]

JP-A-2001-147659

A pixel in FIG. 20A has TFTs 11, 12, 13 and 14, a storage capacitor 15, and a light-emitting element 16.

The gate of the TFT 11 is connected to a terminal 18. One of the source and drain is connected to a current source 17, and the other is connected to the drain of a TFT 13. The gate of the TFT 12 is connected to a terminal 19. One of the source and drain is connected to the drain of the TFT 13, and the other is connected to the gate of the TFT 13. The gates of the TFT 13 and TFT 14 are connected to each other, and the sources of them are both connected to the terminal 20. The drain of the TFT 14 is connected to the anode of the light-emitting element 16, and the cathode of the light-emitting element 16 is connected to a terminal 21. The storage capacitor 15 holds the voltage between the gate and source of the TFTs 13 and 14. Predetermined amounts of voltages are applied to the terminals 20 and 21, which have a voltage difference.

The TFTs 11 and 12 are turned ON by the voltage to be supplied to the terminals 18 and 19, and the drain current of the TFT 13 is then controlled by the current source 17. Here, since the gate and drain are connected, the TFT 13 operates in the saturated region. The drain current is expressed by Equation 1 mentioned below.

$$I_D = \mu C_0 W/L (V_{GS} - V_{TH})^2 / 2 \quad [\text{EQ1}]$$

where $V_{GS}$ is a gate voltage, and $\mu$ is a mobility. $C_0$ is a gate capacity for a unit area, and W/L is the ratio of a channel width W and a channel length L of a channel forming region. $V_{TH}$ is a threshold value, and $I_D$ is a drain current.

In EQ 1, all of $\mu$, $C_0$, W/L, and $V_{TH}$ are fixed values depending on the transistor. Apparently from EQ 1, the drain current of the TFT 13 depends on the gate voltage $V_{GS}$. Therefore, in accordance with EQ 1, the gate voltage $V_{GS}$ corresponding to the drain current occurs in TFT 13.

Here, since the gates and sources of the TFT 13 and TFT 14 are connected to each other, the gate voltage of the TFT 14 is maintained to be equal to the gate voltage of the TFT 13. Thus, the drain currents of the TFT 13 and TFT 14 are on a proportional basis. When the values of $\mu$, $C_0$, W/L, and $V_{TH}$ thereof are equal, the drain currents of the TFT 13 and TFT 14 are equal. The drain current of the TFT 14 is supplied to the light-emitting element 16, and the light-emitting element 16 emits light with the intensity corresponding to the magnitude of the drain current.

Especially, by increasing the ratio of the On-current of the TFT 14 to that of the TFT 13, a desired magnitude of a current can be supplied to the light-emitting element with a short writing time.

Even after the TFTs 11 and 12 are turned off by the voltage supplied to the terminals 18 and 19, the light-emitting element 16 keeps emitting light as far as the gate voltage $V_{GS}$ of the TFT 14 is retained by the storage capacitor 15.

Next, the construction of the current-input pixel disclosed in Non-Patent Document 1 mentioned below will be described with reference to FIG. 20B.

[Non-Patent Document 1]
Tech. Digest IEDM 98, 875. R. M. A. Dawson etc.

A pixel in FIG. 20B has TFTs 31, 32, 33 and 34, a storage capacitor 35, and a light-emitting element 36.

The gate of the TFT 31 is connected to a terminal 38. One of the source and drain of the TFT 31 is connected to a current source 37, and the other is connected to the source of the TFT 33. The gate of the TFT 34 is connected to a terminal 38. One of the source and drain of the TFT 34 is connected to the gate of the TFT 33, and the other is connected to the drain of the TFT 33. The gate of the TFT 32 is connected to a terminal 39, and one of the source and drain of the TFT 32 is connected to a terminal 40, and the other is connected to the source of the TFT 33. The drain of the TFT 33 is connected to the anode of the light-emitting element 36, and the cathode of the light-emitting element 36 is connected to a terminal 41. The storage capacitor 35 is provided for retaining a voltage between the gate and source of the TFT 33. Predetermined amounts of voltages are applied from the power source to the terminals 40 and 41 and have a voltage difference.

The TFTs 31 and 34 are turned on by the voltage supplied to the terminal 38, and the TFT 32 is turned off by the voltage supplied to the terminal 39. Then, the drain current of the TFT 33 is controlled by the current source 37. Here, since the gate and drain of the TFT 33 are connected, the TFT 33 operates in a saturated region. The drain current is expressed by EQ1. It is understood that the drain current of TFT 33 varies depending on the gate voltage $V_{GS}$. In accordance with EQ1, the gate voltage $V_{GS}$ corresponding to the drain current occurs in the TFT 33. The gate voltage $V_{GS}$ is retained by the storage capacitor 35.

The drain current flowing in the TFT 33 is supplied to the light-emitting element 36, and the light-emitting element 36 emits light with the intensity corresponding to the magnitude of the drain current.

After the TFTs 31 and 34 are turned off by the voltage supplied to the terminal 38, the TFT 32 is turned on by the voltage supplied to the terminal 39. Here, as far as the gate voltage of the TFT 33 is retained by the storage capacitor 35, the light-emitting element 36 emits light with the same intensity as that when the TFTs 31 and 34 are on.

Even when the characteristics such as threshold values and On-current vary among a current-input pixels shown in FIGS. 20A and 20B, the magnitude of the current to be supplied to the light-emitting element is controlled by the current source. Therefore, the variation in intensity of the light-emitting elements of the pixels can be prevented.

Next, the construction of the threshold value corrected voltage input pixel as disclosed in Patent Document 2 mentioned below will be described with reference to FIG. 21.

[Patent Document 2]
U.S. Pat. No. 6,229,506, Specification

A pixel shown in FIG. 21 has TFTs 51, 52, 53 and 54, storage capacitors 55 and 56 and a light-emitting element 57.

The gate of the TFT 51 is connected to a terminal 59. One of the source and drain of the TFT 51 is connected to a terminal 58, and the other is connected to one electrode of the storage capacitor 55. The other electrode of the storage capacitor 55 is connected to the gate of the TFT 53. The gate of the TFT 52 is connected to a terminal 61. The source of the TFT 52 is connected to the gate of the TFT 53, and the drain of the TFT 52 is connected to the drain of the TFT 53 and the source of the TFT 54. The source of the TFT 53 is connected to a terminal 60, and the storage capacitor 56 is provided for retaining volume between the gate and source of the TFT 53. The gate of the TFT 54 is connected to a terminal 62, and the drain of the TFT 54 is connected to the anode of the light-emitting element 57. The cathode of the light-emitting element 57 is connected to a terminal 63. Predetermined amounts of voltages are applied from the power source to the terminals 60 and 63, which have a voltage difference. Here, the amount of voltage to the terminal 60 is higher than the amount of the voltage to the terminal 63.

First of all, the height of the voltage to be applied to the terminal 58 is equalized to the height of the volume to be applied to the terminal 60. After the voltage to be applied to the terminal 59 is controlled to turn on the TFT 51, the voltages to be applied to the terminals 61 and 62 are controlled to turn on the TFTs 52 and 54. Then, the storage capacitors 55 and 56 start to store charges. When the voltage retained in the storage capacitor 56 exceeds a threshold value ($V_{TH}$) of the TFT 53, the TFT 53 is turned on.

Next, when the TFT 54 is turned off, the charges stored in the storage capacitors 55 and 56 are discharged through the TFT 53 in ON state. Here, since the TFT 52 is ON, the gate and drain of the TFT 53 are connected. Therefore, the TFT 53 operates in a saturated region. The drain current when charges are discharged is expressed by EQ1.

The discharging continues until $I_D=0$, that is, until the TFT 53 is turned off. Since all of $\mu$, $C_0$, W/L, and $V_{TH}$ are fixed values depending on each transistor in EQ1, $V_{GS}=V_{TH}$ in accordance with EQ1 when $I_D=0$. In other words, when the TFT 53 is turned off by the discharging, the amount of voltage $V_{TH}$ corresponding to the threshold value of the TFT 53 is stored in the storage capacitor 56.

Next, the TFT 52 is turned off, and a voltage $V_{Data}$ of a video signal is applied to the terminal 58. Because of the input of the video signal, the sum voltage of the threshold voltage $V_{TH}$ and the voltage $V_{Data}$ is stored in the storage capacitor 56 in accordance with the Law of Conservation of Charges.

Next, after the TFT 51 is turned off, the TFT 54 is turned on so that the drain current of the TFT 53 is supplied to the light-emitting element 57. Here, the drain current of the TFT 53 is controlled by the sum voltage of the threshold voltage $V_{TH}$ and the voltage $V_{Data}$ retained in the storage capacitor 56. Thus, irrespective of the threshold value $V_{TH}$ of the TFT 53, the current corresponding to the voltage $V_{Data}$ is supplied to the light-emitting element 57. Thus, the uneven intensity due to the variation in threshold value can be suppressed.

As described above, the current-input pixel shown in FIG. 20 and the threshold value corrected voltage input pixel shown in FIG. 21 can suppress the variations in a current flowing in the light-emitting element due to the variations in characteristics of TFTs more than the pixel shown in FIG. 19. However, the pixels with those constructions have problems.

Typically as shown in FIG. 20A, a pixel may have two units including a unit (such as the TFT 13) for converting a current supplied to the pixel to a voltage and retaining the voltage and a unit (such as the TFT 14) for passing a predetermined amount of a current corresponding to the retained voltage to the light-emitting element. In this case, the balance of the characteristics between these two units may vary due to a shift of the characteristic of one unit. Then, the amount of a current to be supplied from the driving portion to the light-emitting element cannot be kept in a desired amount. Thus, a variation in intensity of the light-emitting element may occur among pixels.

In particular, when any of $\mu$, $C_0$, W/L, and $V_{TH}$, which are unique characteristics of a TFT, is shifted in the TFT 13 or TFT 14 in FIG. 20A, the ratio of the drain current of the TFT 14 to the drain current of the TFT 13 may differ among pixels. As a result, the intensity of the light-emitting element may vary among the pixels.

On the other hand, typically as shown in FIG. 20B, a pixel may have a unit (such as the TFT 33) for converting a current supplied to the pixel to a voltage, retaining the voltage, and feeding the amount of a current corresponding to the retained voltage to a light-emitting element. In this case, a current flows in the light-emitting element when the current supplied to the pixels is converted to a voltage. The light-emitting element has a larger capacity. Therefore, when the display changes from a lower grayscale to a higher grayscale, the value of a voltage to be converted from the current is not stable until a certain degree of charges are stored in the capacity of the light-emitting element. Thus, the change in the display from a lower grayscale to a higher grayscale takes time. Conversely, when the display changes from a higher grayscale to a lower grayscale, the value of a voltage to be converted from a current is not stable until extra charges of the capacity of the light-emitting element are discharged. Therefore, the change in the display from a higher grayscale to a lower grayscale takes time.

In particular, in FIG. 20B, when the value of a current supplied from the current source 37 changes, the longer time is required until the gate voltage of the TFT 33 is stable. Thus, the time for writing a current becomes longer. As a result, the persistence of vision may be visually identified, and the advantage of the light-emitting element suitable for moving image display because of the rapid responsibility is not used effectively.

In a pixel typically as shown in FIG. 21, the amount of voltage corresponding to the threshold value of a TFT (such as the TFT 53) for controlling the current to be supplied to a light-emitting element may be written in the storage capacitor in advance. In this case, a current does not flow to the light-emitting element when the amount of voltage corresponding to the threshold value is written into the storage capacitor. Therefore, the writing time does not depend on the capacity of the light-emitting element as shown in FIG. 20B.

However, after charges enough to turn on the TFT 53 are stored in the storage capacitor, the charges must be discharged through the TFT 53 until the voltage retained in the storage capacitor reaches the threshold value voltage $V_{TH}$. Therefore, the time required for the discharging does not reduce the writing time. Then, the pixels typically as shown in FIG. 21 cannot handle the case that the writing time must be further reduced for the time-grayscale display using digital signals, for example. As a result, the persistence of view may be visually identified in moving image display, and the advantage of the light-emitting element suitable for moving image display because of the rapid responsibility is not used effectively.

SUMMARY OF THE INVENTION

Accordingly, the present invention was made in view of these problems. It is an object of the invention to provide a light-emitting device, a method for driving a light-emitting device and an element board, which can suppress variations in intensity of a light-emitting device among pixels and which prevents the persistence of view from being visually identified easily.

The invention is a current-input light-emitting device and a threshold-value-corrected, voltage-input light-emitting device, driven by using a transistor (called multi terminal transistor hereinafter), which can control the short and open, that is, the connection of four terminals (nodes) as an element for controlling a current to be supplied to a light-emitting element. The term, "connection", herein means an electrical connection unless especially mentioned.

The light-emitting device includes a panel in which light-emitting elements are sealed and a module in which IC including a controller or the like is implemented on the panel. Furthermore, the invention relates to an element board corresponding to a form before a light-emitting element is finished in a process for producing the light-emitting device. The element board includes a unit for supplying a current to a light-emitting element in each of multiple pixels.

In other words, the current-input light-emitting device according to the invention feeds a current corresponding to a given video signal between two nodes of four nodes of a multi-terminal transistor to convert the current to a voltage, shorts two nodes different from the above-described two nodes, converts the voltage to a current again, and supplies the current to a light-emitting element.

More specifically, a pixel of the current-input light-emitting device of the invention includes:

means for shorting or opening four nodes by controlling a voltage of the gate;

means for retaining the voltage of the gate;

means for controlling the connection between a first node and the gate;

means for controlling a current flowing between the first node and the second node;

means for controlling a current flowing between the third node and a fourth node; and a light-emitting element to which the current flowing between the third node and the fourth node is supplied.

The element board of the invention corresponds to a form before a light-emitting element is finished in a process for producing the current-input light-emitting device. More specifically, the element board includes:

means for shorting or opening four nodes by controlling a voltage of the gate;

means for retaining the voltage of the gate;

means for controlling the connection between a first node and the gate;

means for controlling a current flowing between the first node and a second node;

means for controlling a current flowing between a third node and a fourth node and supplying the current flowing between the third node and the fourth node to a light-emitting element.

Since a current can be converted to a voltage without feeding a current to a light-emitting element with this construction, the writing time can be suppressed more than that of the pixel shown in FIG. 20B. A single multi-terminal transistor can convert a current supplied to a pixel to a voltage, retain the voltage and feed the amount of a current corresponding to the amount of the retained voltage. Therefore, unlike the pixel shown in FIG. 20A, the variations in intensity of the light-emitting elements of pixels can be prevented.

The ratio (L/W) of the channel length and channel width between two nodes (first node and second node) for converting a current corresponding to a given video signal to a voltage is smaller than L/W between two nodes (third and fourth nodes) for converting the voltage to a current again and supplying the current to the light-emitting element. In other words, the channel length between two nodes for converting a current corresponding to a given video signal to a voltage is made shorter than the channel length between two nodes for converting the voltage to a current again and supplying the current to the light-emitting element.

As the channel width increases, the On-current can be increased. As the channel length increases, the linear characteristic of the saturated region can be increased.

Therefore, with the construction, the writing time can be suppressed, and, at the same time, a desired magnitude of a current can be supplied to a light-emitting element. Thus, the linear characteristic of the saturated region can be increased when the light-emitting element is caused to emit light. As a result, the variations in intensity among pixels can be suppressed.

Furthermore, the threshold-value-corrected, voltage-input light-emitting device according to the invention shorts two nodes of four nodes of a multi-terminal transistor to write the threshold value voltage into a storage capacitor and the amount of voltage corresponding to a given video signal into a storage capacitor. Next, two nodes different from the above-described nodes are shorted, and the two voltages are converted to a current, which is then supplied to the light-emitting element.

More specifically, a pixel of a threshold-value-corrected, voltage-input light-emitting device of the invention includes a unit for shorting or opening four nodes by controlling a voltage of the gate;

means for retaining the voltage of the gate;

means for controlling the connection between a second node and the gate;

means for controlling the magnitude of a voltage retained in the means for retaining a voltage of the gate when the second node and the gate are connected by the means for controlling the connection between the second node and the gate;

means for controlling a current flowing between the third node and the fourth node; and a light-emitting element to which the current flowing between the third node and the fourth node is supplied.

The element board of the invention corresponds to a form before a light emitting element is finished in a process for producing the voltage-input light-emitting device. The element board includes:

means for shorting or opening four nodes by controlling a voltage of the gate;

means for retaining the voltage of the gate;

means for controlling the connection between a second node and the gate;

means for controlling the magnitude of a voltage retained in the means for retaining a voltage of the gate when the second node and the gate are connected by the means for controlling the connection between the second node and the gate;

means for controlling a current flowing between a third node and a fourth node and supplying the current flowing between the third node and the fourth node to a light-emitting element.

The ratio (L/W) of the channel length and channel width between two nodes for writing the threshold voltage of the multi-terminal transistor into the storage capacitor and for writing the voltage corresponding to a given video signal is made smaller than the L/W between two nodes for converting the voltage to a current and supplying the current to the light-emitting element. In other words, the channel length between two nodes for writing the threshold voltage of the multi-terminal transistor into the retention capacity and for writing the amount of voltage corresponding to a given video signal into the retention capacity is made smaller than the channel length between two nodes for converting the voltage to a current and for supplying the current to the light-emitting element.

With this construction, the speed of a series of operations can be improved for storing charges in a storage capacitor, discharging the charges until the voltage retained in the storage capacitor reaches the threshold voltage $V_{TH}$, and writing the amount of voltage corresponding to a given video signal into the storage capacitor can be improved. At the same time, a desired magnitude of a current can be fed to a light-emitting element. Furthermore, the linear characteristic of the saturated region when the light-emitting element is caused to emit light, and the variations in intensity among pixels therefore can be more suppressed.

In particular, a multi-terminal transistor has an active layer, an insulating layer in contact with the active layer and a gate electrode in contact with the insulating film. The active layer has at least one channel forming region and at least four impurity regions. The four impurity regions correspond to nodes for exchanging a voltage or a current between the multi-terminal transistor and the other elements.

Each of the four impurity regions, which are nodes, is only in contact with any one of the channel forming regions. In other words, no other impurity regions, which is a node, is provided between two arbitrary impurity regions in the four impurity regions, which are nodes.

The arbitrary impurity region includes a region (low density impurity region) having a lower density of impurity. The low density impurity region may be in contact with the channel forming region. With this construction, the electric field concentration near the impurity region can be alleviated.

The gate electrode lies on the channel forming region through the insulating film. By controlling the voltage to be applied to the gate electrode, the resistance between the nodes can be controlled to short or open.

The multi-terminal transistor according to the invention may have a gate electrode between a substrate and the active layer or may have the active layer between the gate electrode and the substrate.

In the light-emitting device according to the invention, the transistor for a pixel (including a multi-terminal transistor) may be a transistor of polycrystal silicon, a thin film transistor of amorphous silicon, or a transistor having an organic semiconductor.

The transistor for the pixels in the light-emitting device according to the invention may have a single-gate structure, a double-gate structure or a multi-gate structure having more gate electrodes.

DESCRIPTION OF THE PREFERRED EMBODIMENTS

[First Embodiment]

A construction of a current-input light-emitting device according to the invention will be described below. Multiple pixels are arranged in a matrix form in a pixel portion of the current-input light-emitting device of the invention. Various wires such as a signal line, a power source line and a scanline are further provided in the pixel portion.

Figure 1A:
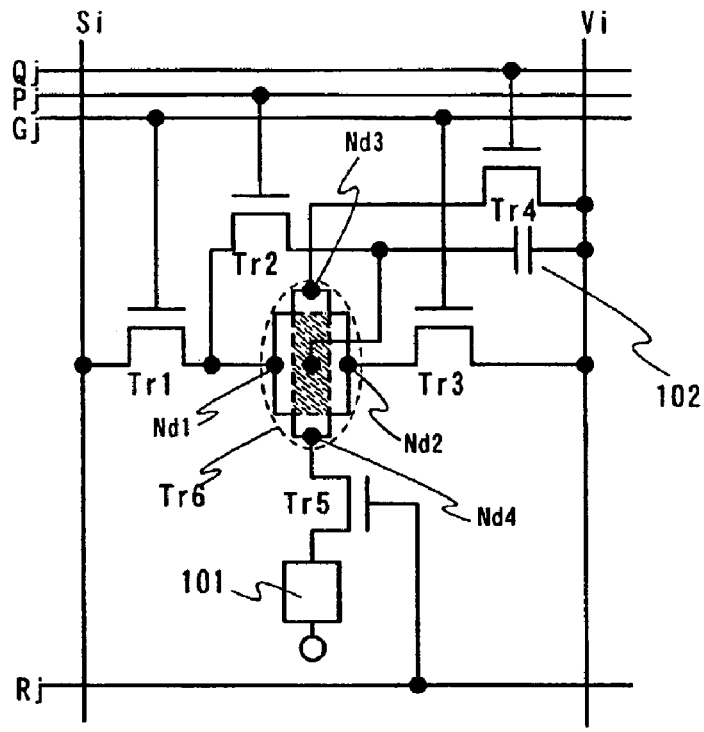
FIGS. 1A and 1B are circuit diagrams of pixels of a light-emitting device according to the invention.

FIG. 1A shows a circuit diagram of a pixel in the current-input light-emitting device according to the invention. In FIG. 1A, each pixel includes six transistors Tr1 to Tr6, a light-emitting element 101, and a storage capacitor 102. Each of the transistors Tr1 to Tr5 controls the short and open of two nodes (that is, the source and drain). The transistor Tr6 controls the short and open of four nodes.

The transistor Tr6 corresponds to a unit for shorting or opening four nodes by controlling the voltage of the gate. The storage capacitor 102 corresponds to a unit for retaining the volume of the gate. The transistor Tr2 corresponds to a unit for controlling the connection between a first node and the gate. The transistors Tr1 and Tr3 correspond to a unit for controlling a current flowing between the first node and the second node. The transistors Tr4 and Tr5 correspond to a unit for controlling a current flowing between a third node and a fourth node. The light-emitting element 101 corresponds to a light-emitting element to which the current flowing between the third node and the fourth node is supplied.

An element board may correspond to a form before the light-emitting element is finished and may have a pixel electrode of the light-emitting element to which the current flowing between the third node and the fourth node is supplied. Alternatively, the element board may have a conductive film to be a pixel electrode, thereon and may correspond to a form before the pixel electrode is formed by patterning.

The gate of the transistor Tr1 is connected to a first scanline Gj (where j=1 to y). One of the source and drain of the transistor Tr1 is connected to a signal line Si (where i=1 to x) and the other is connected to a first node Nd1 of the transistor Tr6.

The gate of the transistor Tr2 is connected to a second scanline Pj (where j=1 to y). One of the source and drain of the transistor Tr2 is connected to the gate of the transistor Tr6, and the other is connected to the first node Nd1 of the transistor Tr6.

The gate of the transistor Tr3 is connected to the first scanline Gj (where j=1 to y). One of the source and drain of the transistor Tr3 is connected to a power source line Vi (where i=1 to x), and the other is connected to a second node Nd2 of the transistor Tr6.

The gate of the transistor Tr4 is connected to a third scanline Qj (where j=1 to y). One of the source and drain of the transistor Tr4 is connected to the power source line Vi (where i=1 to x), and the other is connected to a third node Nd3.

The gate of the transistor Tr5 is connected to a fourth scanline Rj (where j=1 to y). One of the source and drain of the transistor Tr5 is connected to a fourth node Nd4, and the other is connected to the pixel electrode of the light-emitting element 101.

The light-emitting element 101 has the anode and the cathode. Here, when the anode is used as a pixel electrode, cathode is called opposite electrode. When the cathode is used as a pixel electrode, the anode is called opposite electrode.

The storage capacitor 102 is provided for retaining a voltage between the gate of the transistor Tr6 and the power source line Vi.

A predetermined amount of voltages is supplied from the power source to the power source lines V1 to Vx and to the opposite electrode. The power source lines V1 to Vx and the opposite electrode have a voltage difference enough to feed a forward biased current to the light-emitting element. The voltage of the power source lines V1 to Vx may not keep the same height. For example, in a light-emitting device for displaying color images, the height of the voltage may be changed for each corresponding color.

The polarity of the transistors Tr1 to Tr6 may be either of the n-channel type or the p-channel type. However, the transistors Tr1 and Tr3 must have the same polarity. When the anode is used as the pixel electrode while the cathode is used as the opposite electrode, the transistor Tr6 is desirably a P-channel type transistor. Conversely, when the anode is used as the opposite electrode while the cathode is used as the pixel electrode, the transistor T6 is desirably an n-channel type transistor.

The numbers of the signal lines and power source lines are not always the same. The numbers of the first scanline, the second scanline, third scantine and fourth scanline are not always the same.

While both of the gates of the transistors Tr1 and Tr3 are connected to the first scanline Gj in FIG. 1A, another scanline may be provided and the gates of the transistors Tr1 and Tr3 may be connected to different scanlines. In this case, the polarities of the transistors Tr1 and Tr3 may not be the same.

Figure 1B:
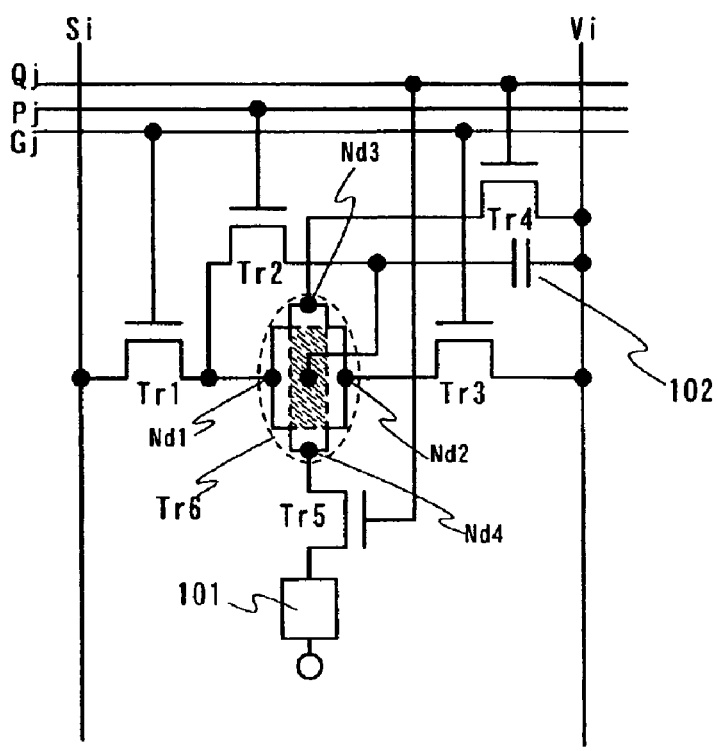

Both of the gates of the transistors Tr4 and Tr5 may be connected to the third scanline Qj. FIG. 1B shows a circuit diagram of a pixel where both of the gates of the transistors Tr4 and Tr5 are connected to the third scanline Qj. In FIG. 1B, the transistors Tr4 and Tr5 have the same polarity. The pixel in FIG. 1B may have a lower number of scanlines than that of the pixel shown in FIG. 1A.

Next, the detail construction of the transistor Tr6 will be described. The transistor Tr6 is a multi-terminal transistor, which can short or open four nodes. The short or open of the four nodes may be controlled by a voltage supplied to the gate.

Figure 2A:
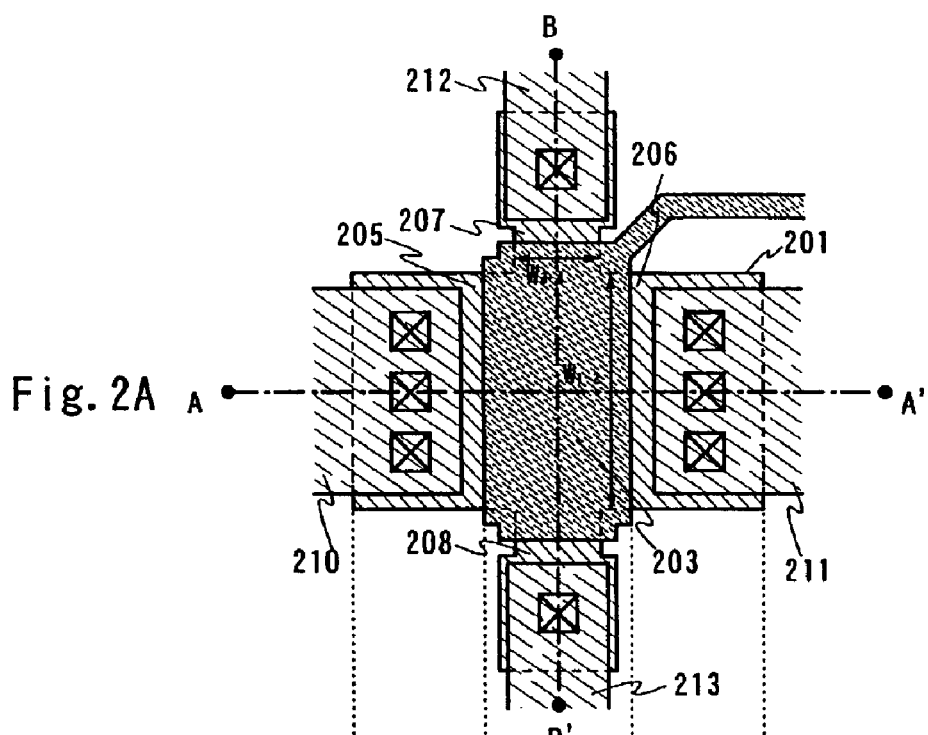
FIGS. 2A to 2C are diagrams each showing a construction of a multi-terminal transistor.
Figure 2B:
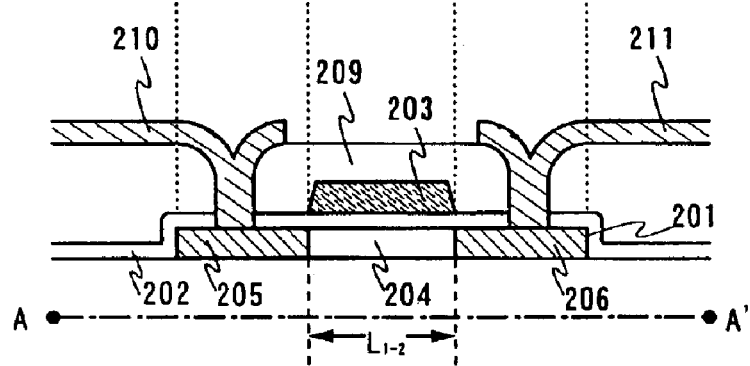
Figure 2C:
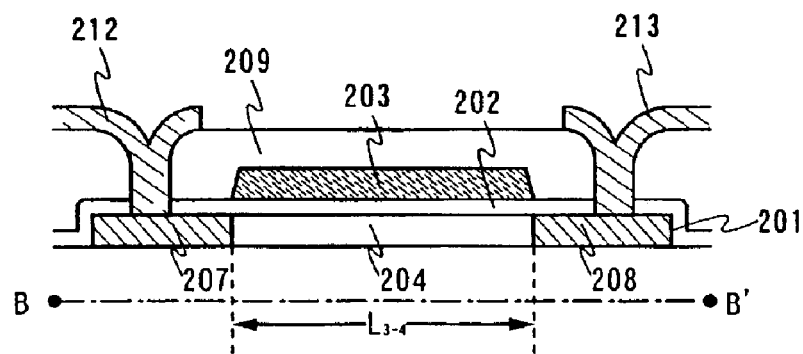

FIG. 2A is a plan view of the transistor Tr6. FIG. 2B is a section diagram taken at a dashed line A–A' in FIG. 2A. FIG. 2C is a section diagram taken at a dashed line B–B' in FIG. 2A.

The transistor Tr6 has an active layer 201, a gate insulating film 202 in contact with the active layer 201, and a gate electrode (gate) 203 in contact with the gate insulating film 202. The active layer 201 has a channel forming region 204 and impurity regions 205 to 208 containing impurities giving the conductive types. The gate electrode 203 and the channel forming region 204 overlap through the gate insulating film 202.

The impurity regions 205 to 208 are in contact with the channel forming region 204. A low density impurity region (LDD region) having a lower impurity density may be provided within the impurity region. In this case, the low density impurity region is made in contact with the channel forming region 204. A region, which does not overlap with the gate electrode and does not contain an impurity (offset region), may be provided between the channel forming region and the impurity regions.

The layout of the channel forming region 204 of the transistor Tr6 is set such that On-current flowing between the first node Nd1 and the second node Nd2 is larger than On-current flowing between the third node Nd3 and the fourth node Nd4. More specifically, for example, the ratio $L_{1-2}/W_{1-2}$ of the length and width of the channel forming region 204 between the impurity regions 205 and 206 is set to be smaller than the ratio $L_{3-4}/W_{3-4}$ of the length and width of the channel forming region 204 between the impurity regions 207 and 208.

In particular, when $L_{1-2}=/W_{3-4}$ and $L_{3-4}=/W_{1-2}$, $L_{1-2}/L_{3-4}$ is preferably $\frac{1}{5}$ or smaller and $\frac{1}{20}$ or larger. For example, (in case) $L_{1-2}=5$ $\mu$m and $L_{3-4}=50$ $\mu$m, the On-current flowing between the first node Nd1 and the second node Nd2 is the order of 100 times of the On-current flowing between the third node Nd3 and the fourth node Nd4.

An interlayer insulating film 209 is on the gate insulating film 202 all over the active layer 201. Wires 210 to 213 are connected to the impurity regions 205 to 208, respectively, through contact holes on the interlayer insulating film 209 and the gate insulating film 202. While the gate insulating film 202 covers the impurity regions 205 to 208 in FIGS. 2A to 2C, the invention is not limited to this construction. The impurity regions 205 to 208 do not have to be covered by the gate insulating film 202 but may be exposed.

In the transistor Tr6, the resistance between the impurity regions 205 to 208 and the resistance between the wires 210 to 213 are controlled by the voltage applied to the gate electrode 203, and the short and the open are controlled.

The construction shown in FIGS. 2A to 2C is an example of the transistor Tr6. The transistor Tr6 may have two or more channel forming regions between impurity regions, that is, may have a so-called multi-gate structure.

Next, the driving of the pixel shown in FIG. 1A will be described.

Figure 3A:
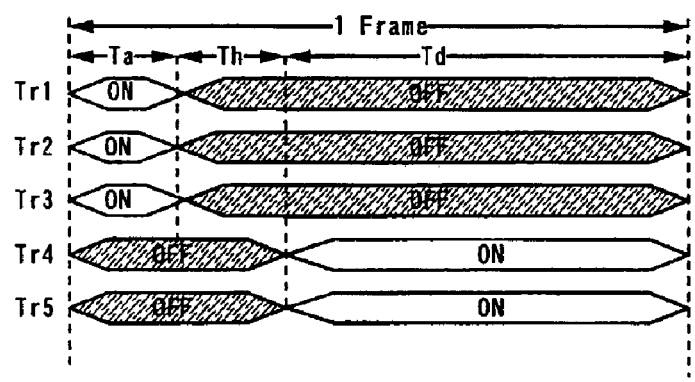
FIGS. 3A and 3B are timing charts for operations and scanlines of transistors.
Figure 3B:
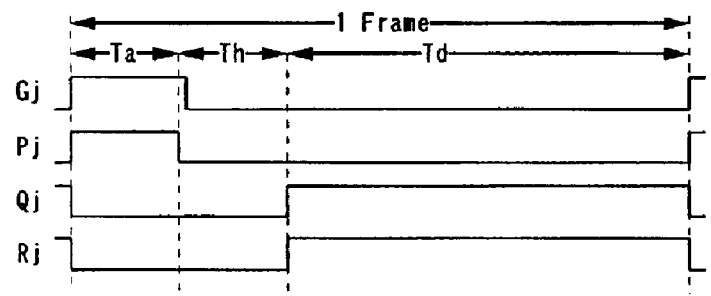

The driving of a pixel of the current-input light-emitting device may be divided into a writing time period Ta, a holding time period Th and a display time period Td in the description. FIG. 3A shows timing for switching the transistors Tr1 to Tr5 in these time periods. FIG. 3B shows a timing chart of a voltage input to scanlines in these time periods when the transistors Tr1 to Tr5 of the pixel in FIG. 1A are all n-channel type TFTs.

Figure 4A:
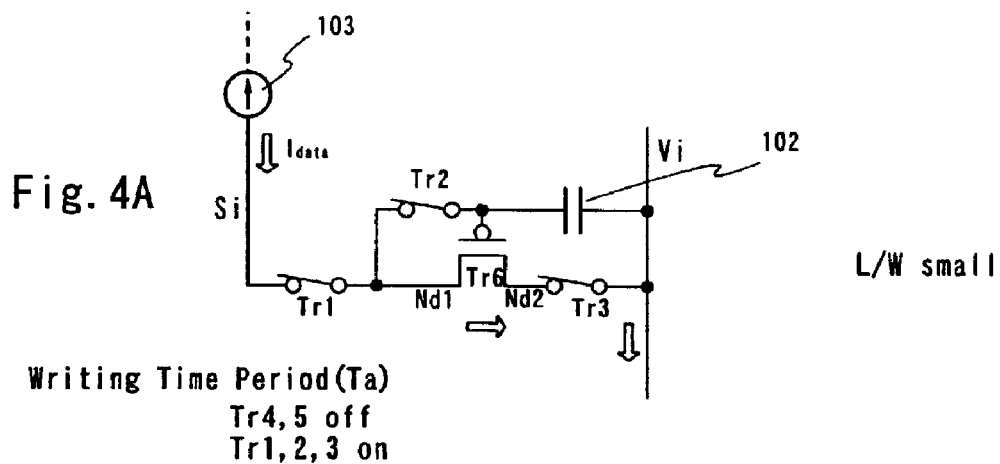
FIGS. 4A to 4C are schematic diagrams of pixels in driving.

First of all, the writing time period Ta is started sequentially in pixels in each line. When the writing time period is started, the transistors Tr1 to Tr3 are turned on, and the transistors Tr4 and Tr5 are turned off. FIG. 4A shows a schematic diagram of the construction of a pixel in the writing time period. In the writing time period Ta current (signal current) $I_{data}$ corresponding to a given video signal is input from a current source 103 in the driving circuit to a signal line Si.

Then, the signal current $I_{data}$ flows between the signal line Si and the power source line Vi through the nodes Nd1 and Nd2 of the transistor Tr6. That is, the drain current $I_D$ flowing between the nodes Nd1 and Nd2 of the transistor Tr6 maintains substantially the same value as that of the signal line $I_{data}$.

Since the gate of the transistor Tr6 in the writing time period Ta is connected to the node Nd1, the transistor Tr6 operates in the saturated region. Therefore, the drain current $I_D$ is expressed by EQ1. Since all of $\mu$, $C_0$, W/L, and $V_{TH}$ are fixed values depending on the transistor, the gate voltage $V_{GS}$ of the transistor Tr6 is determined by the value of the signal current $I_{data}$. The gate voltage $V_{GS}$ is retained by the storage capacitor 102.

Figure 4B:
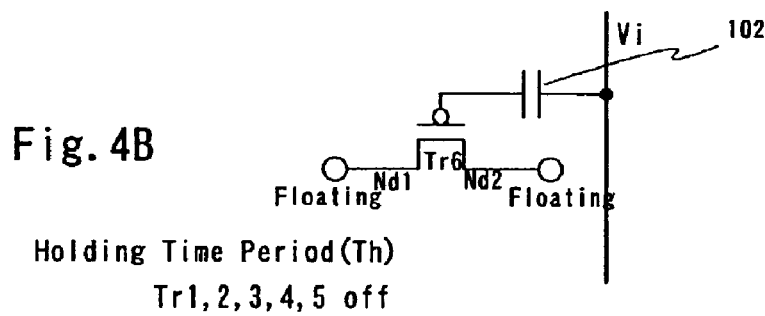

Once the writing time period Ta ends in the pixels in each line, the holding time period Th starts. In the holding time period Th, the transistors Tr1 to Tr5 are all turned off. FIG. 4B shows a schematic diagram of the construction of a pixel in the holding time period. The transistor Tr2 is desirably turned off before the turning off of the transistors Tr1 and Tr3. By turning off the transistor Tr2 earlier, the discharging from the storage capacitor 102 through the transistor Tr2 can be prevented, and the voltage can be held securely.

Figure 4C:
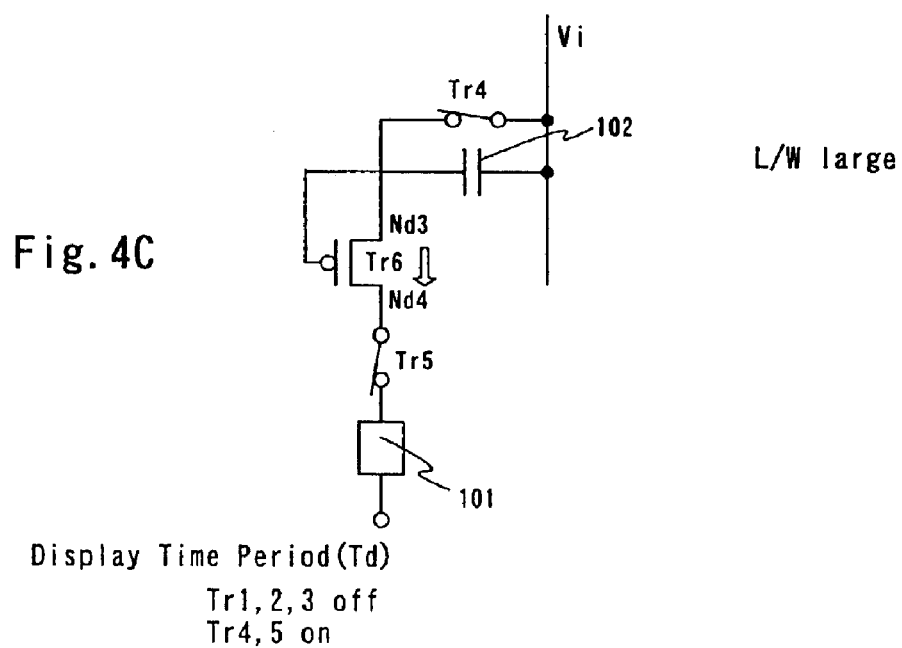

Once the holding time period Th ends in the pixels in each line, the display time period Td starts. When the display time period Td starts, the transistors Tr1 to Tr3 are turned off, and the transistors Tr4 and Tr5 are turned on. FIG. 4C shows a schematic diagram of the construction of a pixel in the display time.

When the transistors Tr4 and Tr5 are turned on, the amount of drain current $I_D$ corresponding to the gate voltage $V_{GS}$ retained in the storage capacitor 102 is supplied to the light-emitting element 101 through the nodes Nd3 and Nd4 of the transistors Tr6. The light-emitting element 101 emits light in intensity corresponding to the supplied current. When the drain current $I_D$ is equal to or lower than the threshold value of the light-emitting element 101, the light-emitting element 101 does not emit light.

If the given video signal is analog, one frame period ends when the display time period Td ends. Then, one image is displayed. Then, the next frame period starts, and the above-described operation is repeated. The grayscale of each pixel depends on the amount of a current supplied to the light-emitting element 101 in the display time period Td.

If the given video signal is digital, and if the time-grayscale display is to be performed, one frame period includes multiple sub-frame times. The ratio of the lengths of the sub-frame times satisfy $2^0:2^1:\ldots:2^{n-1}$. Each of the sub-frame times includes the writing time period Ta, the holding time period Th, and the display time period Td. By controlling the light emission for each of the sub-frame times, the grayscale can be displayed throughout one frame period.

Figure 20A:
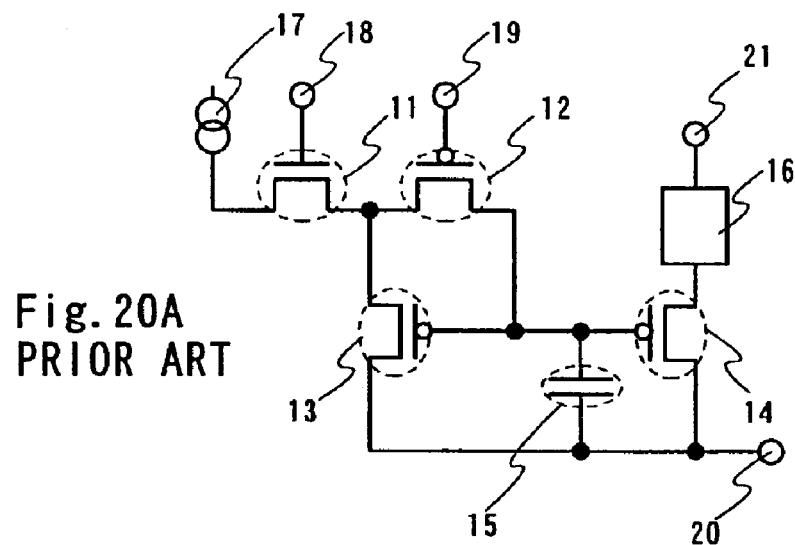
FIGS. 20A and 20B are circuit diagrams of a pixel of the conventional light-emitting device.

In the current-input light-emitting device according to the invention current can be converted to a voltage without feeding the current to the light-emitting element in the writing time period Ta. Thus, the current writing time period can be shorter than that of the pixel shown in FIG. 20B. A single multi-terminal transistor can convert a current supplied to the pixel to a voltage, retains the voltage, and feeds the magnitude of a current corresponding to the retained voltage to the light-emitting element. Therefore, unlike the pixel shown in FIG. 20A, the variations in intensity of the light-emitting elements of pixels can be prevented.

As the channel width increases, the amount of On-current can be increased. As the channel length increases, the linear characteristic of the saturated region can be increased. Therefore, the channel length between the two nodes Nd1 and Nd2 when the current corresponding to a given video signal is converted to a voltage may be made shorter than the channel length between the two nodes Nd3 and Nd4 when the voltage is converted to a current again and the current is supplied to the light-emitting element. Thus, the length of the writing time period Ta can be reduced, and the desired amount of a current can be supplied to the light-emitting element. Furthermore, the linear characteristic of the saturated region of the transistor Tr6 in the display time period Td can be increased, and the variations in intensity among pixels can be suppressed.

[Second Embodiment]

The construction of a threshold-value-corrected, voltage-input light-emitting device according to the invention will be described. Multiple pixels are arranged in a matrix form in a pixel portion of the threshold-value-corrected, voltage-input light-emitting device of the invention. Various wires such as a signal line, a power source line and a scanline are provided in the pixel portion.

Figure 5A:
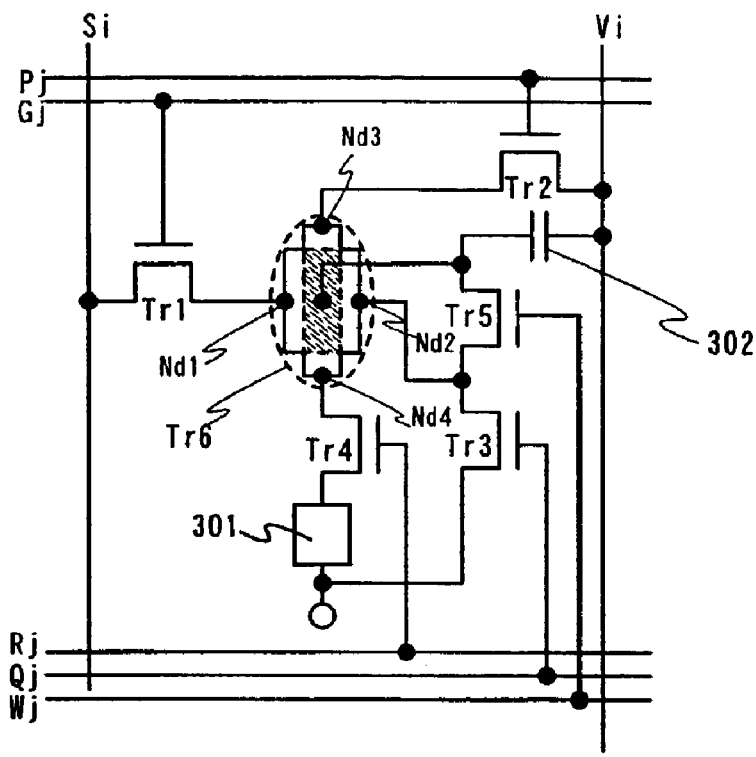
FIGS. 5A and 5B are circuit diagrams of a pixel of the light-emitting device according to the invention.

FIG. 5A shows a circuit diagram of a pixel in the threshold-value-corrected, voltage-input light-emitting device of the invention. In FIG. 5A, each pixel has six transistors Tr1 to Tr6, a light-emitting element 301, and a storage capacitor 302. Each of the transistors Tr1 to Tr5 controls the short and open of two nodes (source and drain), and the transistor Tr6 controls the short and open of four nodes.

The transistor Tr6 corresponds to a unit for shorting or opening four nodes by controlling a voltage of the gate. The storage capacitor 302 corresponds to a unit for retaining the voltage of the gate. The transistor Tr5 corresponds to a unit for controlling the connection between a second node and the gate. Each of the transistors Tr1 and Tr3 corresponds a unit for controlling the amount of voltage retained by the storage capacitor 302 when the second node and the gate are connected by the unit for controlling the connection between the second node and the gate. Each of the transistors Tr2 and Tr4 corresponds to a unit for controlling a current flowing between a third node and a fourth node. The light-emitting element 301 corresponds to a light-emitting element to which a current flowing between the third node and the fourth node is supplied.

An element board corresponds to a form before the light-emitting element is finished. The element board may only include a pixel electrode of the light-emitting element to which a current flowing between the third node and the fourth node is supplied. Alternatively, the form may be after a conductive film to be a pixel electrode is formed and before the pixel electrode is formed by patterning. The element board may have any form.

The detail construction of the transistor Tr6 is the same as that of the transistor Tr6 according to the first embodiment shown in FIGS. 2A to 2C. Therefore, the description will be omitted herein.

The gate of the transistor Tr1 is connected to a first scanline Gj (where j=1 to y). One of the source and drain of the transistor Tr1 is connected to a signal line Si (where i=1 to x) and the other is connected to a first node Nd1 of the transistor Tr6.

The gate of the transistor Tr2 is connected to a second scanline Pj (where j=1 to y). One of the source and drain of the transistor Tr2 is connected to a third node Nd3 of the transistor Tr6, and the other is connected to the power source line Vi (where i=1 to x).

The gate of the transistor Tr3 is connected to a third scanline Qj (where j=1 to y). One of the source and drain of the transistor Tr3 is connected to a second node Nd2, and the other is connected to an opposite electrode of the light-emitting element 301.

The gate of the transistor Tr4 is connected to a fourth scanline Rj (where j=1 to y). One of the source and drain of the transistor Tr4 is connected to a fourth node Nd4, and the other is connected to a pixel electrode of the light-emitting element 301.

The gate of the transistor Tr5 is connected to a fifth scanline Wj (where j=1 to y). One of the source and drain of the transistor Tr5 is connected to the gate of the transistor Tr6, and the other is connected to the second node Nd2 of the transistor Tr6.

The storage capacitor 302 is provided for retaining a voltage between the gate of the transistor Tr6 and the power source line Vi.

A predetermined amount of voltage is supplied from the power source to the power source lines V1 to Vx and to the opposite electrode. The power source lines V1 to Vx and the opposite electrode have a voltage difference enough to feed a forward biased current to the light-emitting element. The voltage of the power source lines V1 to Vx may not keep the same height. For example, in a light-emitting device for displaying color images, the height of the voltage may be changed for each corresponding color.

The polarities of the transistors Tr1 to Tr6 may be either of the n-channel type or the p-channel type. However, when the anode is used as the pixel electrode while the cathode is used as the opposite electrode, the transistor Tr6 is desirably a P-channel type transistor. Conversely, when the anode is used as the opposite electrode while the cathode is used as the pixel electrode, the transistor Tr6 is desirably an n-channel type transistor.

The numbers of the signal lines and power source lines are not always the same. The numbers of the first to fifth scanlines are not always the same.

Figure 5B:
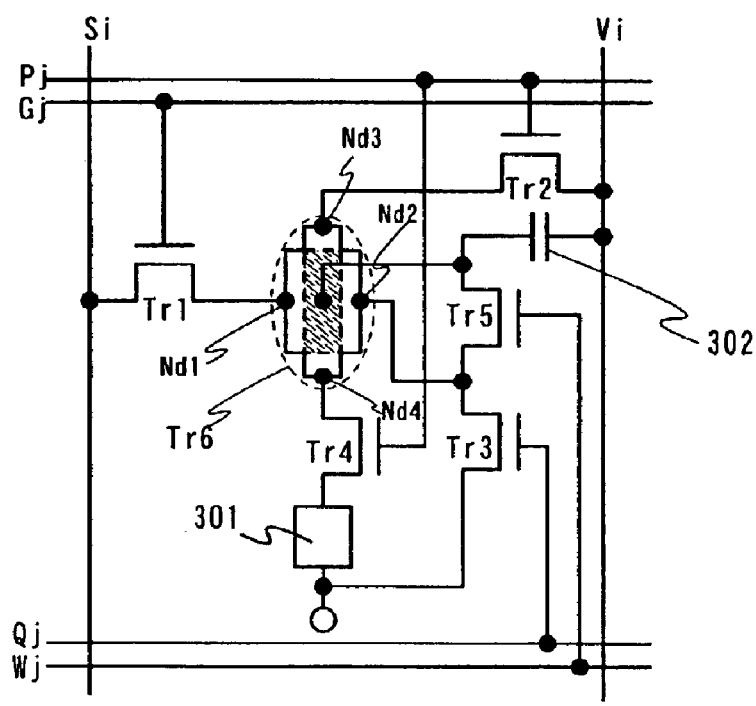

Both of the gates of the transistors Tr2 and Tr4 may be connected to the second scanline Pj. FIG. 5B shows a circuit diagram of a pixel where both of the gates of the transistors Tr2 and Tr4 are connected to the second scanline Pj. In FIG. 5B, the transistors Tr2 and Tr4 have the same polarity. The pixel in FIG. 5B may have a lower number of scanlines than that of the pixel shown in FIG. 5A.

Figure 6:
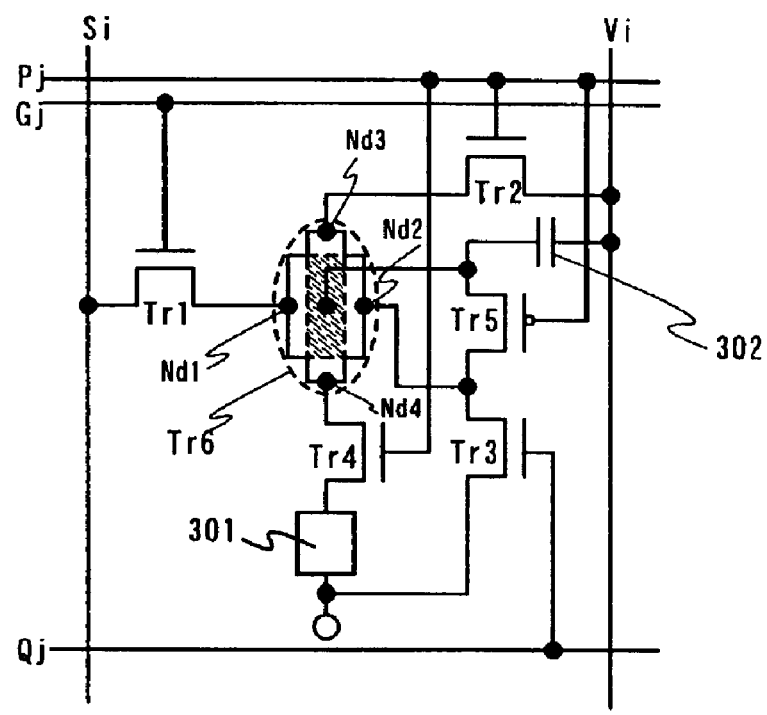
FIG. 6 is a circuit diagram of a pixel of the light-emitting device according to the invention.

All of the gates of the transistors Tr2, Tr4 and Tr5 may be connected to the second scanline Pj. FIG. 6 shows a circuit diagram of a pixel where all of the gates of the transistors Tr2, Tr4 and Tr5 are connected to the second scanline Pj. In FIG. 6, the transistors Tr2 and Tr4 have the same polarity. The transistor Tr5 has the opposite polarity against the polarity of the transistors Tr2 and Tr4. The pixel in FIG. 6 may have a lower number of scanlines than that of the pixels shown in FIGS. 5A and 5B.

Next, the driving of the pixel shown in FIG. 5A will be described.

Figure 7A:
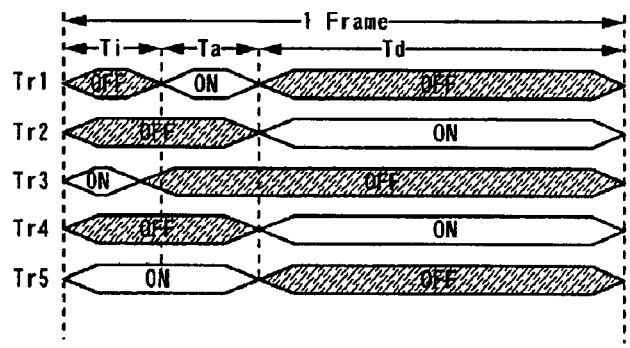
FIGS. 7A and 7B are timing charts for operations and scanlines of transistors.
Figure 7B:
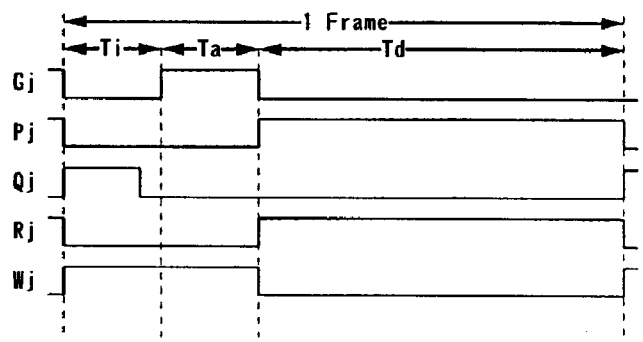

The driving of a pixel of the threshold-value-corrected, voltage-input light-emitting device may be divided into an initializing time period Ti, a writing time period Ta and a display time period Td in the description. FIG. 7A shows timing for switching the transistors Tr1 to Tr5 in these times. FIG. 7B shows a timing chart of a voltage input to scanlines in these times when the transistors Tr1 to Tr5 of the pixel in FIG. 5A are all n-channel type TFTs.

Figure 8A:
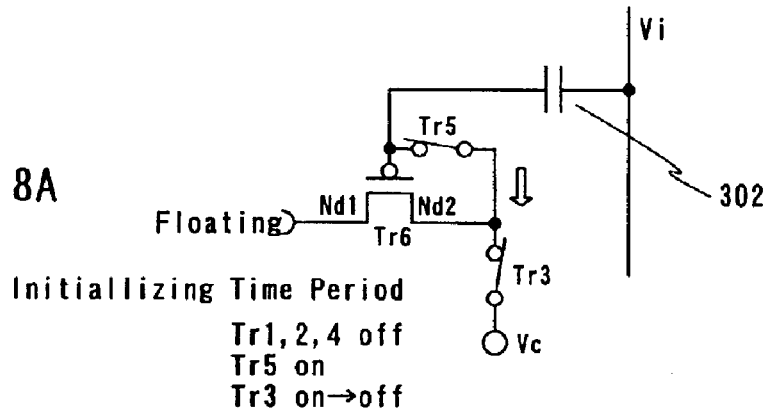
FIGS. 8A to 8C are schematic diagrams of a pixel in driving.
Figure 8B:
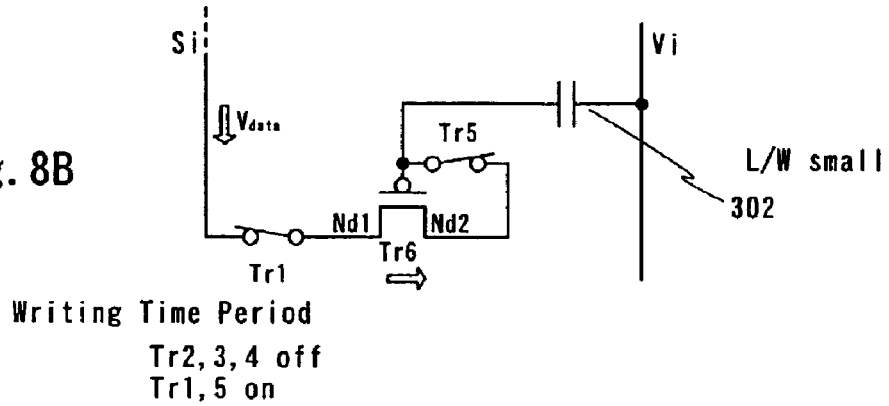

First of all, the initializing time period Ti is sequentially started in pixels in each line. When the initializing time period Ti is started, the transistors Tr3 and Tr5 are turned on, while the transistors Tr1, Tr2 and Tr4 are turned off. FIG. 8A shows a schematic diagram of the construction of the pixel in the initializing time period. Vc is a voltage of the opposite electrode. In the initializing time period T1, the amount of charges corresponding to the voltage of the power source line Vi and the voltage of the opposite electrode are stored in the storage capacitor 302. Since the constant amounts of a voltage are supplied to the power source line Vi and the opposite electrode, the constant amount of charges are always stored in the retention capacity 302 in the initializing time period Ti.

Next, after the transistor Tr3 is turned off, the initializing time period Ti ends in the pixels in each line. Then, the writing time period Ta is started. When the writing time period is started, the transistors Tr1 and Tr5 are turned on, and the transistors Tr2, Tr3 and Tr4 are turned off. Then, a voltage (signal voltage) $V_{data}$ corresponding to a given video signal is input from the driving circuit to a signal line Si. The signal voltage $V_{data}$ is supplied to the storage capacitor 302 through the nodes Nd1 and Nd2 of the transistor Tr6.

The signal voltage $V_{data}$ must be set at the height satisfying $|V_{data}+V_{TH}|<|Vc|$. The drain current $I_D$ flows between the nodes Nd1 and Nd2 of the transistor 6, and the charges stored in the storage capacitor 302 are discharged. Here, since the transistor Tr5 is on, the gate and the node Nd2 of the transistor 6 are connected. Thus, the transistor Tr6 operates in the saturated region. Therefore, the drain current $I_D$ in discharging is expressed by EQ1.

The discharging continues until the $I_D$=0, that is, until the transistor Tr6 is turned off. In EQ1, since all of $\mu$, $C_0$, W/L, and $V_{TH}$ are fixed values depending on the transistor, $V_{GS}=V_{TH}$ in accordance with EQ1 when $I_D$=0. In other words, when the transistor Tr6 is turned off because of the discharging, the sum voltage of the signal voltage $V_{data}$ and the threshold voltage $V_{TH}$ is retained in the storage capacitor 302.

Figure 8C:
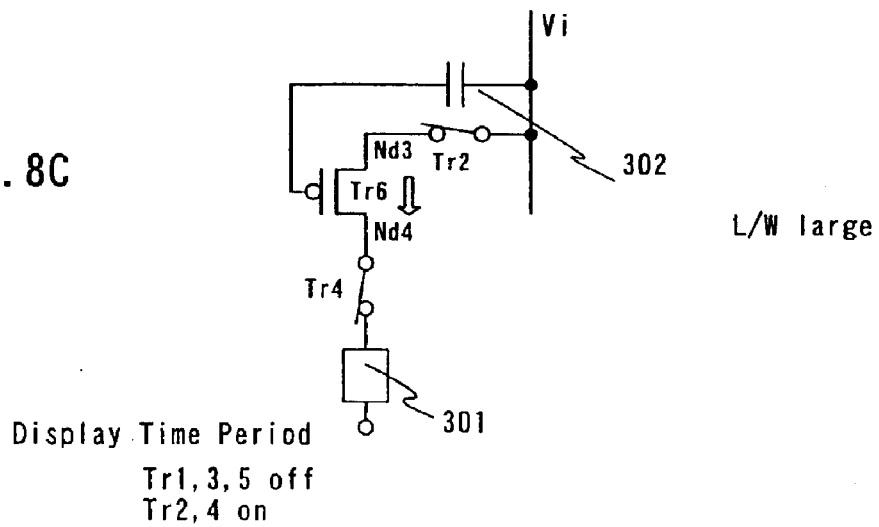

Next, once the writing time period Ta ends in the pixels in each line, the display time period Td starts. When the display time period Td starts, the transistors Tr1, Tr3 and Tr5 are turned off, and the transistors Tr2 and Tr4 are turned on. FIG. 8C shows a schematic diagram of the construction of a pixel in the display time.

When the transistors Tr2 and Tr4 are turned on, the drain current of the transistor Tr6 is supplied to the light-emitting element 301. Here, the drain current of the transistor Tr6 is controlled by the sum voltage of the voltage $V_{data}$ and the threshold value voltage $V_{TH}$, which is retained in the storage capacitor 302. Therefore, irrespective of the threshold value voltage $V_{TH}$ of the transistor Tr6, the current corresponding to the value of the voltage $V_{Data}$ is always supplied to the light-emitting element 301. The light-emitting element 301 emits light in intensity corresponding to the supplied current. As a result, the variations in intensity due to the variations in threshold values can be suppressed. In this case, when the drain current $I_D$ is equal to or lower than the threshold value of the light-emitting element 301, the light-emitting element 301 does not emit light.

If the given video signal is analog, one frame period ends when the display time period Td ends. Then, one image is displayed. Then, the next frame period starts, and the above-described operation is repeated. The grayscale of each pixel depends on the amount of a current supplied to the light-emitting element 301 in the display time period Td.

If the given video signal is digital, and if the time-grayscale display is to be performed, one frame period includes multiple sub-frame times. Each of the sub-frame times includes the initializing time Ti, the writing time period Ta, and the display time period Td. By controlling the light emission for each of the sub-frame times, the grayscale can be displayed throughout one frame period.

As the channel width increases, the amount of On-current can be increased. As the channel length increases, the linear characteristic of the saturated region can be increased. In the threshold-value-corrected, voltage-input light-emitting device of the invention, charges are discharged until the voltage retained in the storage capacitor reaches the threshold value voltage $V_{TH}$. Therefore, the channel length between the two nodes Nd1 and Nd2 when the current corresponding to a given video signal is written in the storage capacitor may be made shorter than the channel length between the two nodes Nd3 and Nd4 the current is supplied to the light-emitting element. Thus, the length of the initializing time period Ti and the writing time period Ta can be reduced, and the desired amount of a current can be supplied to the light-emitting element. Furthermore, the linear characteristic of the saturated region of the transistor Tr6 in the display time period Td can be increased, and the variations in intensity among pixels can be suppressed.

EXAMPLES

Examples of the invention will be described below.

First Example

This example describes the construction of a multi-terminal transistor having a gate electrode between the substrate and the active layer.

Figure 9A:
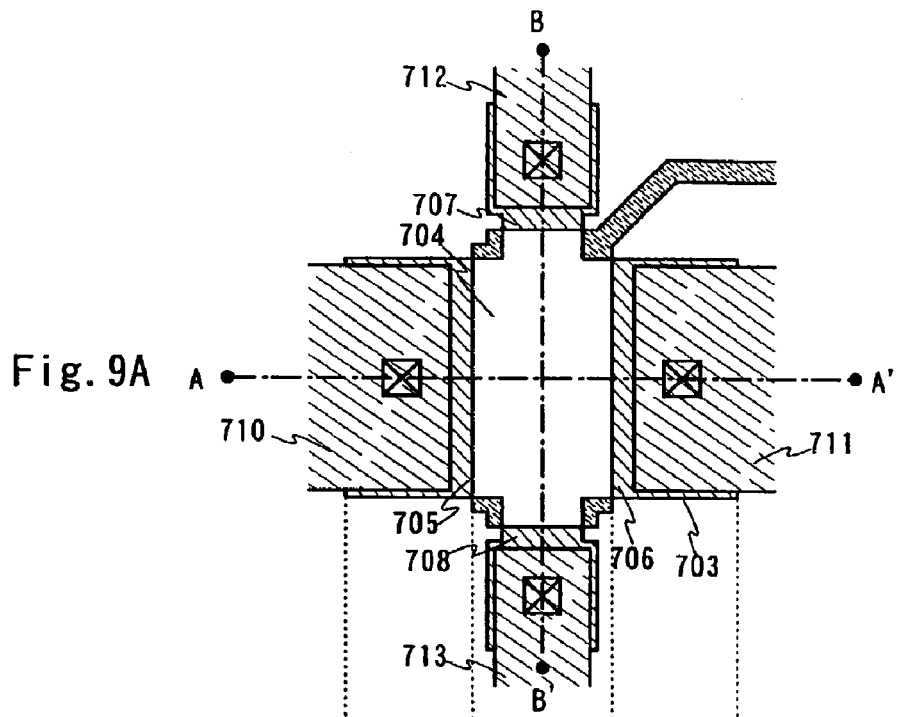
FIGS. 9A to 9C are diagrams each showing a construction of a multi-terminal transistor.
Figure 9B:
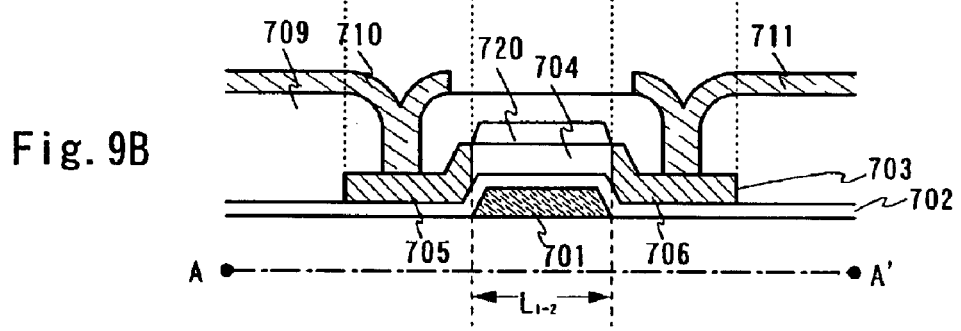
Figure 9C:
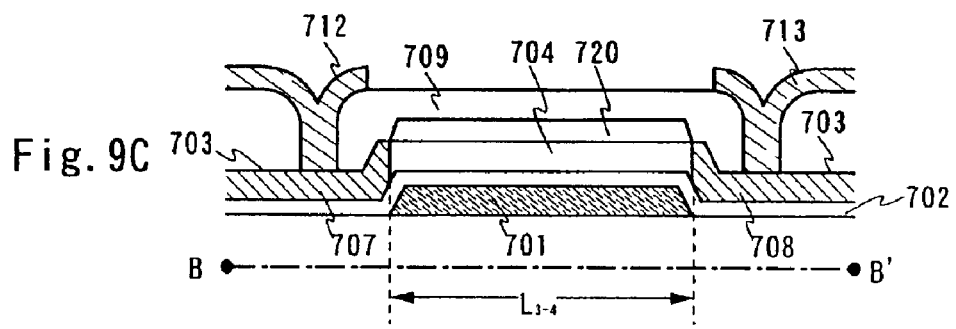

The construction of the multi-terminal transistor (simply called "transistor" hereinafter) will be described with reference to FIGS. 9A to 9C. FIG. 9A is a plan view of the transistor of the invention. FIG. 9B is a section diagram taken at a dashed line A–A' of FIG. 9A. FIG. 9C is a section diagram taken at a dashed line B–B' of FIG. 9A.

The transistor of this invention has a gate electrode 701, a gate insulating film 702 in contact with the gate electrode 701, and an active layer 703 in contact with the gate insulating film 702. The active layer 703 has a channel forming region 704, and impurity regions 705 to 708 containing impurities giving conductive types. The gate electrode 701 and the channel forming region 704 overlap through the gate insulating film 702. The reference numeral 720 in FIG. 9C indicates a mask to be used for forming the channel forming region. The mask 720 contains an insulating film.

The impurity regions 705 to 708 are in contact with the channel forming region 704. A low density impurity region (LDD region) is provided in a part of the impurity region. In this case, the low density impurity region is in contact with the channel forming region 704. A region (offset region) not containing an impurity, which does not overlap with the gate electrode, may be provided between the impurity region and the channel forming region 704.

An interlayer insulating film 709 is provided all over the impurity regions 705 to 708 of the active layer 703. Wires 710 to 713 are connected to the impurity regions 705 to 708, respectively, through contact holes on the interlayer insulating film 709.

In the transistor in FIGS. 9A to 9C, the resistance between the impurity regions 710 to 713 and the resistance between the wires 710 to 713 are controlled by the voltage applied to the gate electrode 701, and the short and the open are controlled.

The layout of the channel forming region 704 of the transistor in FIGS. 9A to 9C is set such that On-current flowing between the impurity region 705, which is a first node Nd1, and the impurity region 706, which is a second node Nd2, is larger than On-current flowing between the impurity region 707, which is a third node Nd3 and the impurity region 708, which is a fourth node Nd4. More specifically, for example, a length $L_{1-2}$ of the channel forming region 704 between the impurity regions 705 and 706 is set to be smaller than a length $L_{3-4}$ of the channel forming region 704 between the impurity regions 707 and 708.

An interlayer insulating film 709 is on the gate insulating film 702 all over the active layer 703. Wires 710 to 713 are connected to the impurity regions 705 to 708, respectively, through contact holes on the interlayer insulating film 709 and the gate insulating film 702. While the gate insulating film 702 covers the impurity regions 705 to 708 in FIGS. 9A to 9C, the invention is not limited to this construction. The impurity regions 705 to 708 do not have to be covered by the gate insulating film 702 but may be exposed.

The construction shown in FIGS. 9A to 9C is an example of the transistor Tr6. The transistor Tr6 may have two or more channel forming regions between impurity regions, that is, the transistor Tr6 may have a so-called multi-gate structure.

Second Example

This example will be described with reference to a mask diagram corresponding to the circuit diagram shown in FIG. 1A.

Figure 10:
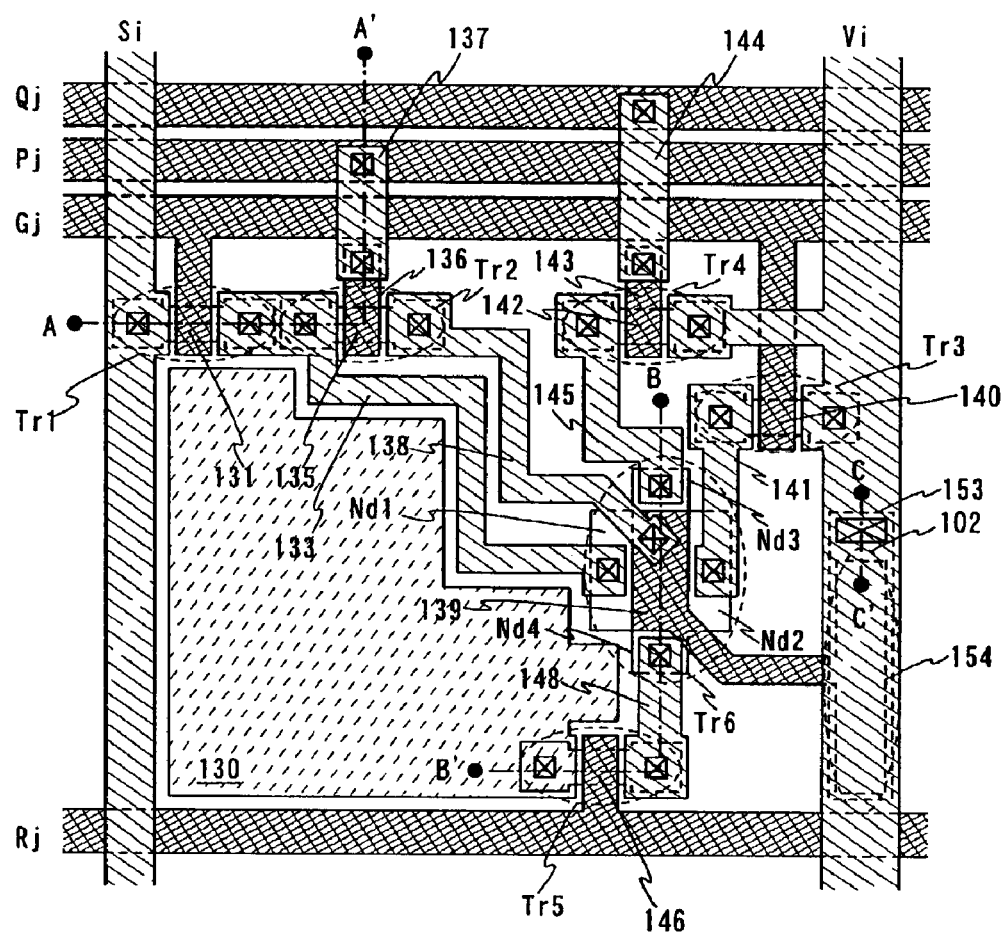
FIG. 10 is a plan view of a pixel of the light-emitting device according to the invention.
Figure 11A:
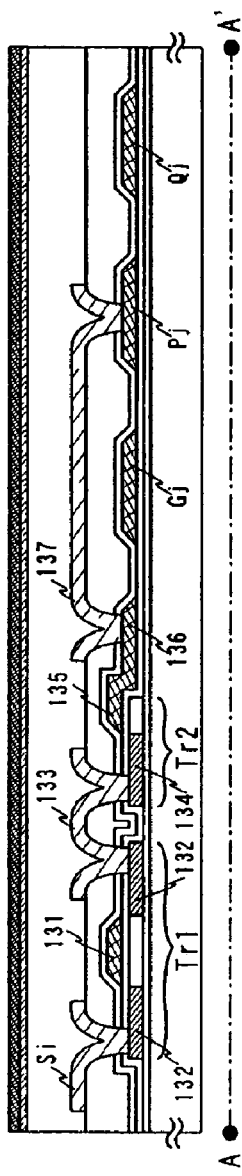
FIGS. 11A to 11C are sectional diagrams of a pixel of the light-emitting device according to the invention.
Figure 11B:
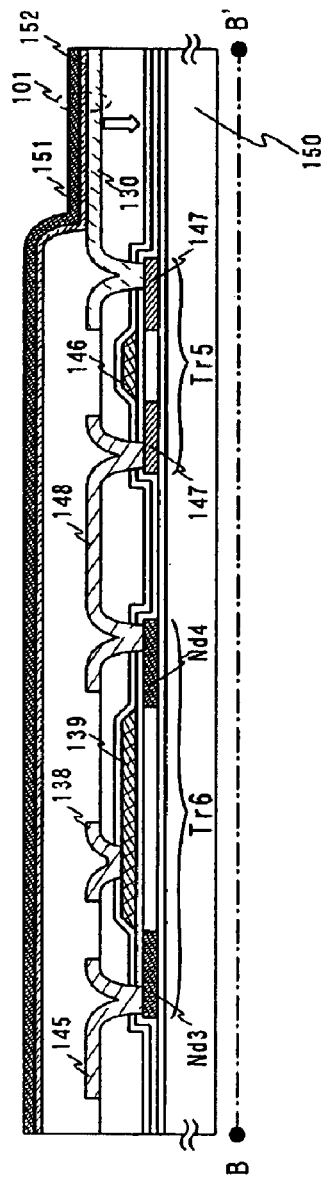
Figure 11C:
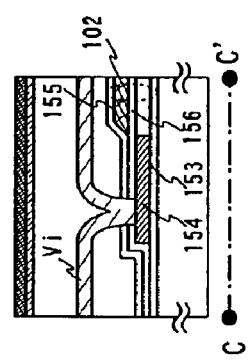

FIG. 10 shows a plan view of a pixel of this example. The same reference numerals are given to the same components as those described with reference to FIG. 1A. In order to clarify the arrangement of the transistor, only the pixel electrode of the light-emitting element is shown in FIG. 10. However, in reality, an electric field light-emitting layer and an opposite electrode lie on the pixel electrode in order. FIG. 11A is a section diagram taken at a dashed line A–A' in FIG. 10. FIG. 11B is a section diagram taken at a dashed line B–B' in FIG. 10. FIG. 11C is a section diagram taken at a dashed line C–C' in FIG. 10.

A gate electrode 131 of the transistor Tr1 is a part of the first scanline Gj. In an impurity region 132 including two parts to be the source and drain of the transistor Tr1, one of the parts is connected to the signal line Si, and the other is connected to an impurity region 134 of the transistor Tr2 and to a first impurity region (Nd1) of the transistor Tr6 through a wire 133.

A gate electrode 135 of the transistor Tr2 is a part of a wire 136. The wire 136 is connected to the second scanline Pj through a wire 137. In an impurity region including two parts to be the source and drain of the transistor Tr2, one (indicated by the reference numeral 134) of the parts is connected to a wire 133, and the other is connected to a gate electrode 139 of the transistor Tr6 through a wire 138.

A gate electrode 140 of the transistor Tr3 is another part of the first scanline Gj. In an impurity region including two parts to be the source and drain of the transistor Tr3, one of the parts is connected to the power source line Vi, and the other is connected to a second impurity region (Nd2) of the transistor Tr6 through a wire 141.

A gate electrode 142 of the transistor Tr4 is a part of a wire 143. The wire 143 is connected to the third scanline Qj through a wire 144. In an impurity region including two parts to be the source and drain of the transistor Tr4, one of the parts is connected to the power source line Vi, and the other is connected to a third impurity region (Nd3) of the transistor Tr6 through a wire 145.

A gate electrode 146 of the transistor Tr5 is a part of the fourth scanline Rj. In an impurity region 147 including two parts to be the source and drain of the transistor Tr5, one of the parts is connected to a fourth impurity region (Nd4) of the transistor Tr6 through a wire 148, and the other is connected to a pixel electrode 130 of the light-emitting element 101. In this example, the anode is used as the pixel electrode 130, and the light emitted from the light-emitting element 101 directs to a substrate 150, as indicated by an arrow in FIG. 11B. The cathode may be used as the pixel electrode 130. In this case, the light emitted from the light-emitting element directs to the opposite side against the substrate 150. In the light-emitting element 101, an electric field light-emitting layer 152 is provided between the pixel electrode 130 and the opposite electrode 151.

An impurity region 154 included in the semiconductor film 153 is connected to the power source line Vi. An electrode 155 for capacity is electrically connected to the gate electrode 139 of the transistor Tr6. The storage capacitor 102 includes the electrode 155 for capacity and the semiconductor film 153 lying on top of one another through a gate insulating film 156.

The construction of the pixel of the current-input light-emitting device according to the invention is not limited to those shown in FIGS. 10 to 11C Third Example This example will be described with reference to a mask diagram corresponding to the circuit diagram shown in FIG. 5A.

Figure 12:
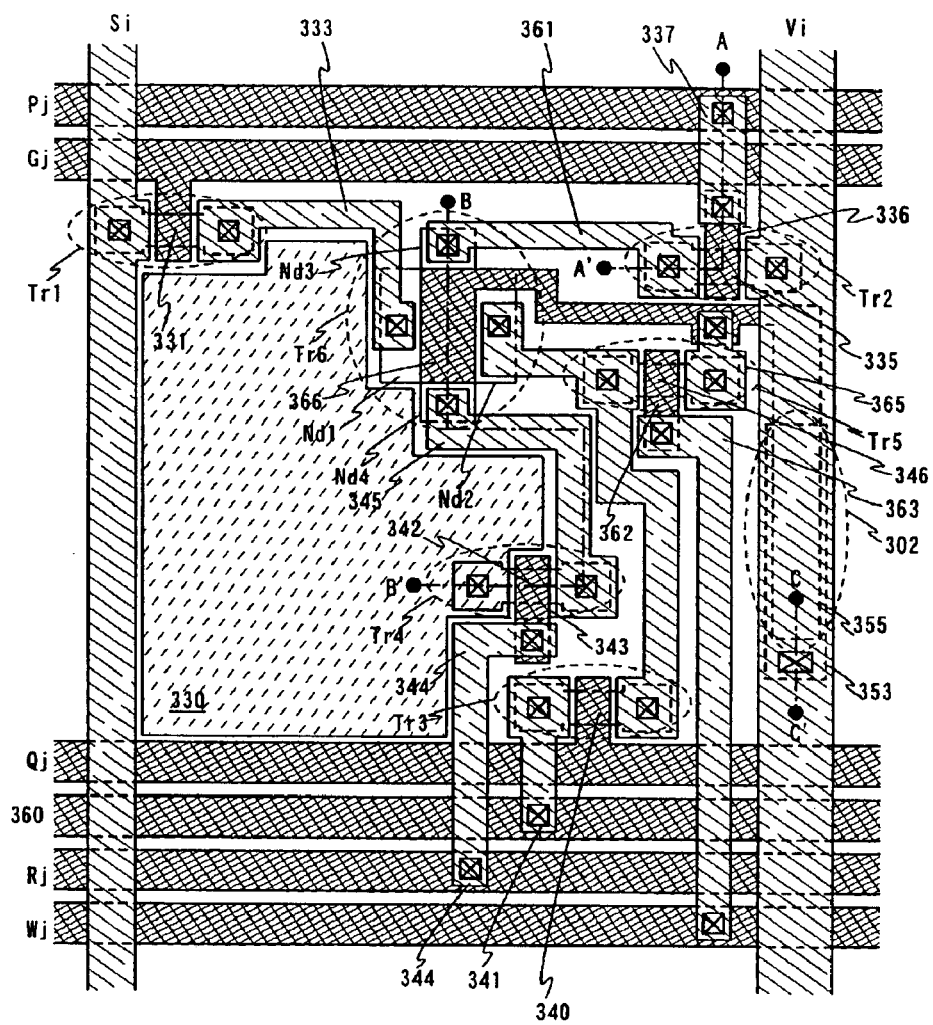
FIG. 12 is a plan view of a pixel of the light-emitting device according to the invention.
Figure 13A:
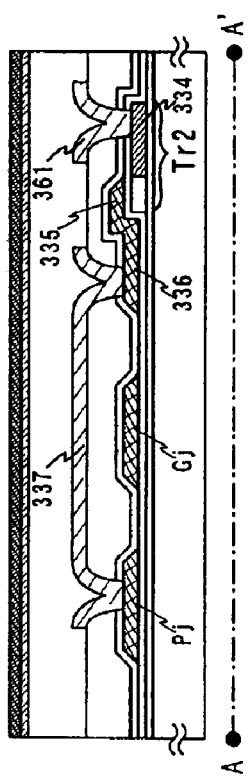
FIGS. 13A to 13C are sectional diagrams of a pixel of the light-emitting device according to the invention.
Figure 13B:
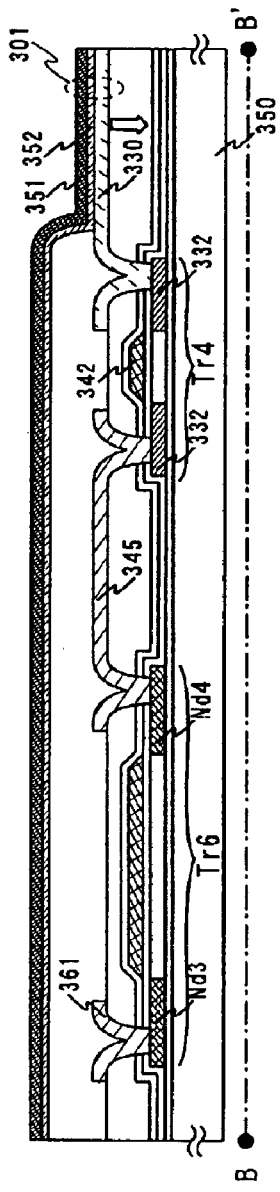
Figure 13C:
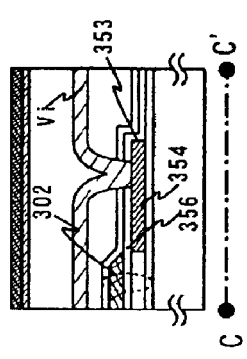

FIG. 12 shows a plan view of a pixel of this example. The same reference numerals are given to the same components as those described with reference to FIG. 5A. In order to clarify the arrangement of the transistor, only the pixel electrode of the light-emitting element is shown in FIG. 12. However, in reality, an electric field light-emitting layer on the pixel electrode and an opposite electrode lie thereon in order. FIG. 13A is a section diagram taken at a dashed line A–A' in FIG. 12. FIG. 13B is a section diagram taken at a dashed line B–B' in FIG. 12. FIG. 13C is a section diagram taken at a dashed line C–C' in FIG. 12.

A gate electrode 331 of the transistor Tr1 is a part of the first scanline Gj. In an impurity region including two parts to be the source and drain of the transistor Tr1, one of the parts is connected to the signal line Si, and the other is connected to a first impurity region (Nd1) of the transistor Tr6 through a wire 333.

A gate electrode 335 of the transistor Tr2 is a part of a wire 336. The wire 336 is connected to the second scanline Pj through a wire 337. In an impurity region including two parts to be the source and drain of the transistor Tr2, one (indicated by the reference numeral 334) of the parts is connected to a third impurity region (Nd3) of the transistor Tr6 through a wire 361, and the other is connected to a power source line Vi.

A gate electrode 340 of the transistor Tr3 is a part of the third scanline Qj. In an impurity region including two parts to be the source and drain of the transistor Tr3, one of the parts is connected to a second impurity region (Nd2) of the transistor Tr6 through a wire 329, and the other is connected to a wire 360 through a wire 341. The same height of a voltage is applied to the wire 360 as the voltage to be applied to the opposite electrode of the light-emitting element.

A gate electrode 342 of the transistor Tr4 is a part of a wire 343. The wire 343 is connected to the fourth scanline Rj through a wire 344. In an impurity region 332 including two parts to be the source and drain of the transistor Tr4, one of the parts is connected to a fourth impurity region (Nd4) of the transistor Tr6 through a wire 345, and the other is connected to a pixel electrode 330.

A gate electrode 346 of the transistor Tr5 is a part of a wire 362. The wire 362 is connected to the fifth scanline Wj through a wire 363. In an impurity region including two parts to be the source and drain of the transistor Tr5, one of the parts is connected to a second impurity region (Nd2) of the transistor Tr6 through a wire 329, and the other is connected to a wire 365. The wire 365 is electrically connected to a gate electrode 366 of the transistor Tr6.

In this example, the anode is used as the pixel electrode 330, and the light emitted from the light-emitting element 301 directs to a substrate 350, as indicated by an arrow in FIG. 13B. The cathode may be used as the pixel electrode 330. In this case, the light emitted from the light-emitting element directs to the opposite side against the substrate 350. In the light-emitting element 301, an electric field light-emitting layer 352 is provided between the pixel electrode 330 and the opposite electrode 351.

An impurity region 354 included in a semiconductor film 353 is connected to the power source line Vi. An electrode 355 for capacity is electrically connected to the gate electrode 366 of the transistor Tr6. The storage capacitor 302 includes the electrode 355 for capacity and the semiconductor film 353 lying on top of one another through a gate insulating film 356.

The construction of the pixel of the threshold-value-connected, voltage-input light-emitting device according to the invention is not limited to those shown in FIGS. 12 to 13C.

Fourth Example

In this example, in a current-input light-emitting device, description on constructions of a signal line driving circuit for controlling a video signal provided to the signal line and a scanline driving circuit for controlling a voltage of the scanline will be given. Note that in this example, a construction of a driving circuit to which an analog video signal is used will be described.

Figure 14A:
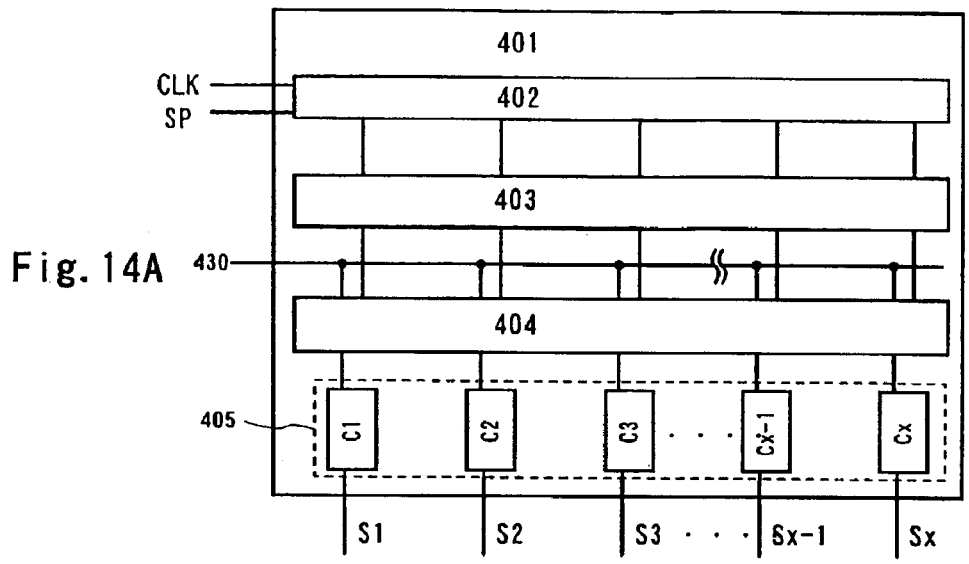
FIGS. 14A and 14B are detail diagrams of a signal line driving circuit by an analog driving method.

FIG. 14A exemplifies a schematic block diagram of a signal-line driving circuit 401. Reference numeral 402 designates a shift register, 403 a buffer, 404 a sampling circuit, and 405 a current converting circuit.

A clock signal (CLK) and a start-up pulse signal (SP) are input to the shift register 402. Upon the input of the clock signal (CLK) and the start-up pulse signal (SP) into the shift register 402, a timing signal is generated. The generated timing signal is amplified or buffered by the buffer 403 and then input to the sampling circuit 404. It is also practicable to replace the buffer with a level shifter to amplify the timing signal. Alternatively, both the buffer and the level shifter may be provided.

Next, synchronously with the timing signal, the sampling circuit 404 delivers an analog video signal input from a video signal line 430 to the current converting circuit 405 located at the subsequent stage. The current converting circuit 405 generates a signal current $I_{data}$ of a magnitude corresponding to a voltage of the input analog video signal and then delivers the generated signal current $I_{data}$ to each of the signal lines (S1 to Sx).

Figure 14B:
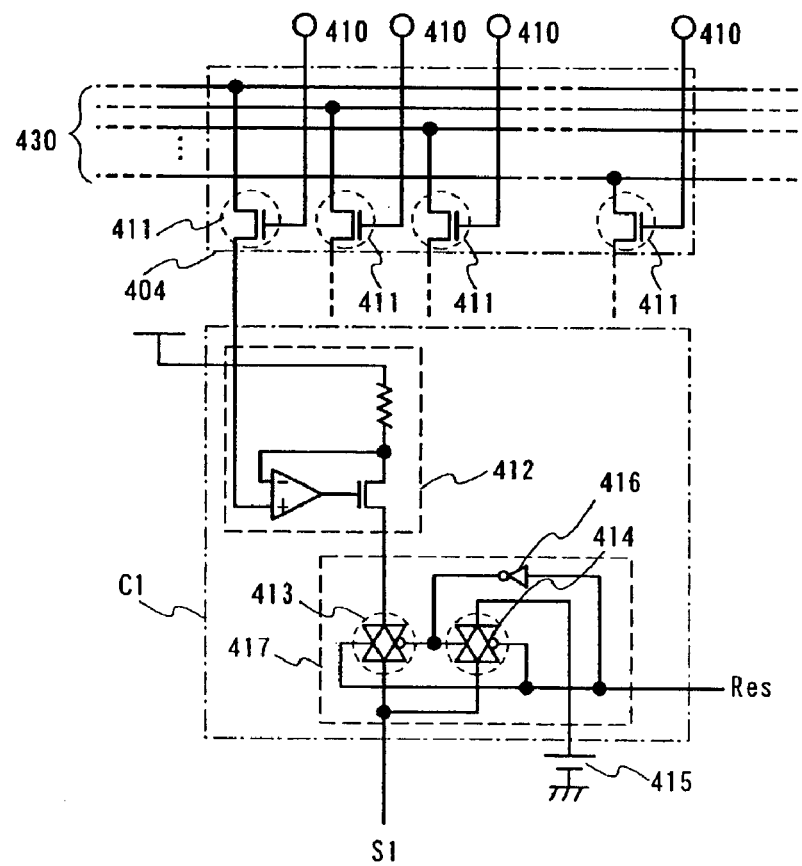

FIG. 14B shows concrete constructions of the sampling circuit 404 and a plurality of current setting circuits C1–Cx provided for the current converting circuit 405. The sampling circuit 404 is connected to the buffer circuit 403 via a terminal 410.

The sampling circuit 404 is provided with a plurality of switches 411. The sampling circuit 404 receives the analog video signals fed from a video signal line 430. Synchronously with the timing signal, the switches 411 individually sample the input analog video signals and then deliver the sampled analog video signals to the current setting circuit C1 located at the subsequent stage. It should be noted that FIG. 14B solely exemplifies the current setting circuit C1 connected to one of the switches 411 built in the sampling circuit 404 among the above-referred current setting circuits C1–Cx. However, it is assumed that the current setting circuit C1 shown in FIG. 14B is connected to each of the individual switches 411 at their subsequent stages provided for the sampling circuit 404.

In this example, only one transistor is utilized for an individual switch 411. It should be understood that, however, insofar as the analog video signal can properly be sampled synchronously with the timing signal, there is no restriction on the construction of the switches 411 described above.

The sampled analog video signals are then input to a current-output circuit 412 provided for the current setting circuit C1. The current-output circuit 412 outputs a signal current of a value corresponding to the voltage borne by the input analog video signals. In FIG. 14B, the current-output circuit 412 is formed by using an amplifier and a transistor. However, the scope of the present invention is not solely limited to this construction but any circuit may also be utilized as the current-output circuit as far as capable of outputting current corresponding to the voltage borne by the input analog video signals.

The above-referred signal current is delivered to a reset circuit 417 present in the current setting circuit C1, where the reset circuit 417 comprises a pair of transmission gates 413 and 414, and an inverter 416.

A reset signal (Res) is input to the transmission gate 414, whereas the other transmission gate 413 receives a reset signal (Res) inverted by the inverter 416. The transmission gate 413 and the other transmission gate 414 are individually operated synchronously with the inverted reset signal and the rest signal, respectively, and thus, while either of the transmission gates 413 and 414 remains ON, the other remains OFF.

While the transmission gate 413 remains ON, the signal current is delivered to a corresponding signal line. On the other hand, while the transmission gate 414 remains ON, a voltage of the power supply 415 is delivered to a corresponding signal line. It is desired that the signal line be reset during the retracing period. However, except for a period during display of pixel, it is also practicable to reset the signal line in such a period other than the retracing period as required.

Next, a construction of a scanline driving circuit will be described.

Figure 15:
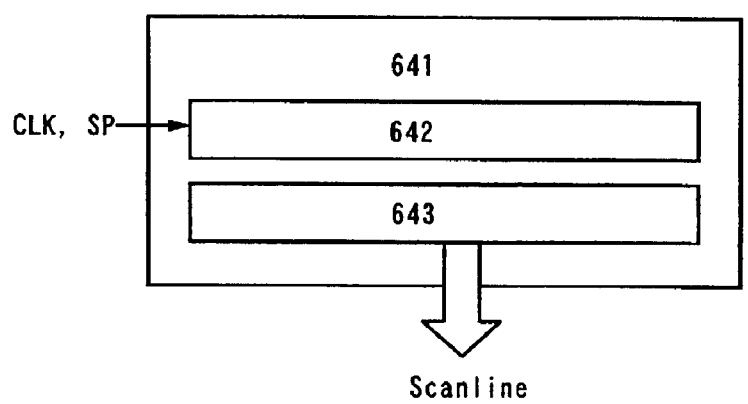
FIG. 15 is a block diagram of a scanline driving circuit.

FIG. 15 exemplifies a schematic block diagram of a scanline driving circuit 641. The scanline driving circuit 641 includes a sift register 642 and buffer 643. According to circumstances, the scanline driving circuit 641 may have a level shifter.

By inputting of the clock signal (CLK) and the start-up pulse signal (SP) into the shift register 642, a timing signal is generated in the scanline driving circuit 641. The generated timing signal is buffered and amplified by the buffer 643 and then supply to a first scanline.

The gates of transistors for one line of pixels are connected to the scanline. The gate of transistors for the one line of pixels must be placed in an ON state simultaneously. A circuit capable of handling the flow of a large electric current is therefore used for the buffer 643.

Practical constructions of the signal-line driving circuit and the scanline driving circuit for the light-emitting device of the present invention are not solely limited to the ones exemplified in FIGS. 14 and 15.

In addition, in place of a shift register, it is also practicable to utilize such a different circuit like a decoder circuit capable of selecting any of scanlines.

The construction of this example may also be realized by being freely combined with those constructions exemplified in the preceding First to Third Examples.

Fifth Example

In this example, in a threshold-value-corrected, voltage-input light-emitting device, description on a construction of a signal line driving circuit for controlling a video signal provided to a signal line will be given. Note that in this example, a construction of a driving circuit to which an analog video signal is used will be described.

Figure 16:
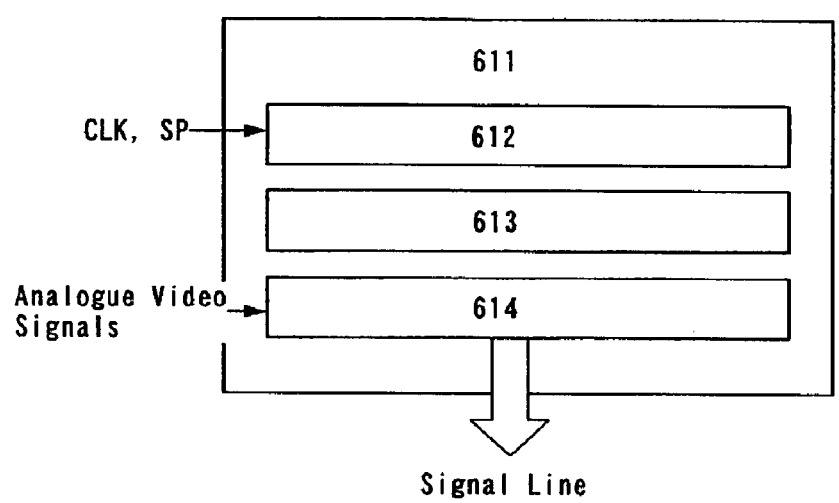
FIG. 16 is a detail diagram of a signal line driving circuit by an analog driving method.

FIG. 16 exemplifies a circuit diagram of a signal-line driving circuit 611. Reference numeral 612 designates a shift register, 613 a level shifter, and 614 a sampling circuit.

A clock signal (CLK) and a start-up pulse signal (SP) are input to the shift register 612. Also, analog video signals (analog video signals) having image information are input to the sampling circuit 614.

Upon the input of the clock signal (CLK) and the start-up pulse signal (SP) into the shift register 612, a timing signal is generated and then input to the level shifter 613. The generated timing signal input in the level shifter 613 is amplified and then input to the sampling circuit 614.

Next, with the timing signal input in the sampling circuit 614, the analog video signals input in the sampling circuit 614 are sampled and then input to corresponding signal lines.

In addition, since the same construction which is used in the scanline driving circuit in the current-input light-emitting device can also be used for a scanline driving circuit here, the description thereof is thus omitted.

The construction of this example may also be realized by being freely combined with those constructions exemplified in the preceding First to Fourth Examples.

Sixth Example

In this example, an external appearance of the light-emitting device of the present invention is described with reference to FIGS. 17A to 17C.

Figure 17A:
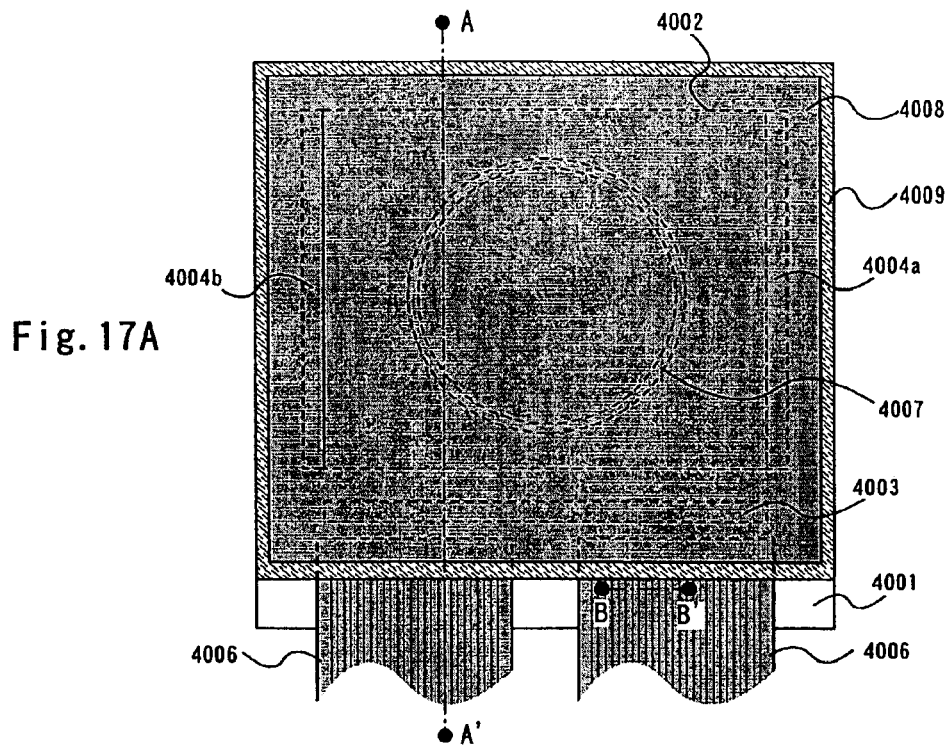
FIGS. 17A to 17C are an appearance diagram and sectional diagrams of a light-emitting device according to the invention.
Figure 17B:
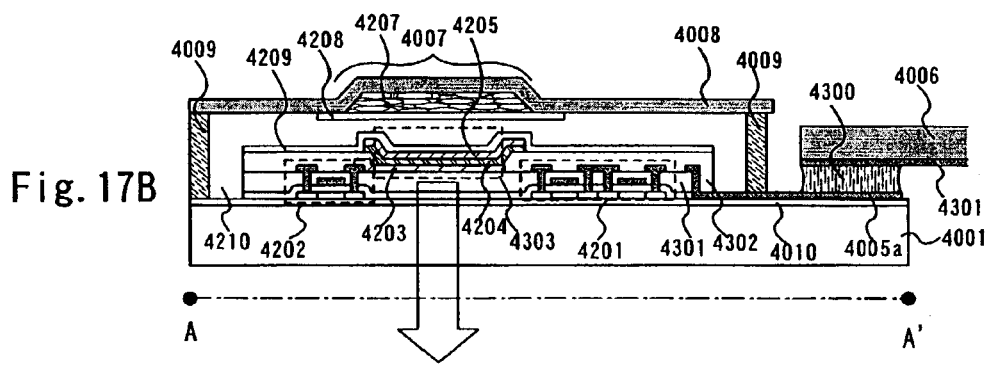
Figure 17C:
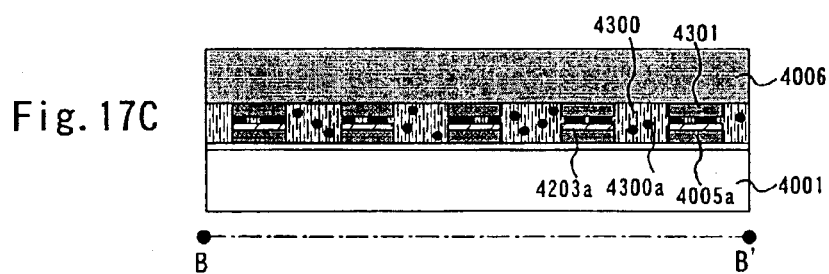

FIG. 17A is a top view of the light-emitting device which is formed by sealing a element substrate formed by transistors with sealing materials, FIG. 17B is a cross sectional view taken along with a line A–A' of FIG. 17A, and FIG. 17C is a cross sectional view taken along with a line B–B' of FIG. 17A.

A seal member 4009 is provided so as to surround a pixel portion 4002, a signal line driving circuit 4003, and scanline driving circuits 4000a, 4000b, all which are provided on a substrate 4001. Further, a sealing material 4008 is provided on the pixel portion 4002, the signal line driving circuit 4003, and the scanline driving circuits 4004a, 4004b. Thus, the pixel portion 4002, the signal line driving circuit 4003, and the scanline driving circuits 4004a, 4004b are sealed with a filler 4210 by the substrate 4001, the seal member 4009 and the sealing material 4008.

In addition, in this example, the voltage for each scanline is controlled by two scanline driving circuits, but the number of the scanline driving circuit is not specially limited. The scanline driving circuit may be provided, for example, to each of corresponding first to fourth scanlines, respectively, in a light-emitting device having pixels shown in FIG. 1A.

Further, the pixel portion 4002, the signal line driving circuit 4003, and the scanline driving circuits 4004a, 4004b, which are provided on the substrate 4001, have a plurality of TFTs. In FIG. 17B, a TFT, hereafter referred to as a driving TFT (only an n-channel TFT and a p-channel TFT are shown in the figure) 4201 included in the signal line driving circuit 4003 and a transistor 4202 included in the pixel portion 4002, which are formed on a base film 4010, are typically shown.

In this example, the p-channel TFT or the n-channel TFT manufactured by a known method is used as the driving TFT 4201, and the n-channel TFT manufactured by a known method is used as the transistor 4202.

An interlayer insulating film (leveling film) 4301 is formed on the driving TFT 4201 and the transistor 4202, and a pixel electrode (anode) 4203 electrically connected to a drain of the transistor 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The transparent conductive film added with gallium may also be used.

Then, an insulating film 4302 is formed on the pixel electrode 4203, and the insulating film 4302 is formed with an opening portion on the pixel electrode 4203. In this opening portion, an electric field light-emitting layer 4204 is formed on the pixel electrode 4203. A known organic electric field light-emitting material or an inorganic electric field light-emitting material may be used for the electric field light-emitting layer 4204. Further, either a monomeric material or a polymeric material may be used as the organic electric field light-emitting material.

A known evaporation technique or an application technique may be used as a method of forming the electric field light-emitting layer 4204. Further, the construction of the electric field light-emitting layer may take a lamination construction by freely combining a hole injection layer, a hole transporting layer, a light-emitting layer, an electron transporting layer, and an electron injection layer. Also, the construction of the organic light-emitting layer may take a single layer construction.

A cathode 4205 made of a conductive film having light-shielding property (typically, conductive film containing aluminum, copper or silver as its main constituent or lamination film of the conductive film and another conductive film) is formed on the electric field light-emitting layer 4204. Further, it is desirable that moisture and oxygen that exist on an interface of the cathode 4205 and the electric field light-emitting layer 4204 are removed as much as possible. Therefore, such a device is necessary that the electric field light-emitting layer 4204 is formed in nitrogen or a rare gas atmosphere, and then, the cathode 4205 is formed without exposure to oxygen and moisture. In this example, the described film deposition is enabled by using a multi-chamber type (cluster tool type) film forming device. And, a predetermined voltage is applied to the cathode 4205.

As described above, a light-emitting element 4303 constituted of the pixel electrode (anode) 4203, the electric field light-emitting layer 4204 and the cathode 4205 is formed. Further, a protective film 4209 is formed on the insulating film 4302 so as to cover the light-emitting element 4303. The protective film 4209 is effective in preventing the intrusion of oxygen, moisture and the like from the light-emitting element 4303.

Reference numeral 4005a denotes a wiring drawn to be connected to the power supply line, and the wiring 4005a is electrically connected to a source region of the transistor 4202. The drawn wiring 4005a passes between the seal member 4009 and the substrate 4001, and is electrically connected to an FPC wiring 4301 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a construction in which an aluminum foil is sandwiched with the PVF film or the Mylar film can also be used.

However, in the case where the light from the light-emitting element is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4210, so that PVC (polyvinyl chloride), acrylic, polyimide, epoxy resin, silicone resin, PVB (polyvinyl butyral) or EVA (ethylene vinyl acetate) can be used. In this example, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the filler 4210 is made to be exposed to the hygroscopic substance (preferably, barium oxide) or the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a construction in which air and moisture are penetrated while the hygroscopic substance or the substance that can absorb oxygen 4207 is not penetrated. The deterioration of the light-emitting element 4303 can be suppressed by providing the hygroscopic substance or the substance that can absorb oxygen 4207.

As shown in FIG. 17C, the pixel electrode 4203 is formed, and at the same time, a conductive film 4203a is formed so as to contact with the surface of the drawn wiring 4005a.

Further, the anisotropic conductive film 4300 has conductive filler 4300a. The conductive film 4203a on the substrate 4001 and the FPC wiring 4301 on the FPC 4006 are electrically connected to each other by the conductive filler 4300a by heat-pressing the substrate 4001 and the FPC 4006.

Note that the construction of Example 6 can be implemented by being freely combined with the constructions shown in First to Fifth Examples.

Seventh Example

The light-emitting device using the light-emitting element is of the self-emission type, and thus exhibits more excellent recognizability of the displayed image in a light place as compared to a liquid crystal display device. Furthermore, the light-emitting device has a wider viewing angle. Accordingly, the light-emitting device can be applied to a display portion in various electronic apparatuses.

Electronic apparatuses using such a light-emitting device of the present invention include a video camera, a digital camera, a goggles-type display (head mount display), a navigation system, a sound reproduction device (a car audio equipment and an audio set), a lap-top computer, a game machine, a portable information terminal (a mobile computer, a mobile phone, a portable game machine, an electronic book, or the like), an image reproduction device including a recording medium (more specifically, an device which can reproduce a recording medium such as a digital versatile disc (DVD) and so forth, and includes a display for displaying the reproduced image), or the like. In particular, in the case of the portable information terminal, use of the light-emitting device is preferable, since the portable information terminal that is likely to be viewed from a tilted direction is often required to have a wide viewing angle. FIGS. 18A to 18H respectively show various specific examples of such electronic apparatuses.

Figure 18A:
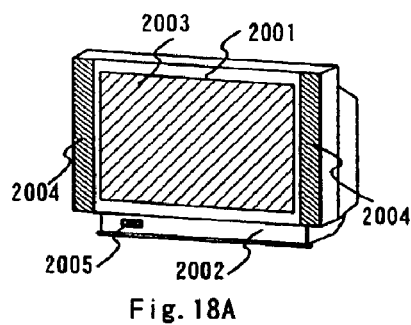
FIGS. 18A to 18H are diagrams of electronic apparatuses using the light-emitting device according to the invention.

FIG. 18A illustrates a display device which includes a casing 2001, a support table 2002, a display portion 2003, a speaker portion 2004, a video input terminal 2005 or the like. The display device of the present invention is completed by use of the light-emitting device of the invention to its display portion 2003. The light-emitting device is of the self-emission-type and therefore requires no backlight. Thus, the display portion thereof can have a thickness thinner than that of the liquid crystal display device. The light-emitting display device is including the entire display device for displaying information, such as a personal computer, a receiver of TV broadcasting and an advertising display.

Figure 18B:
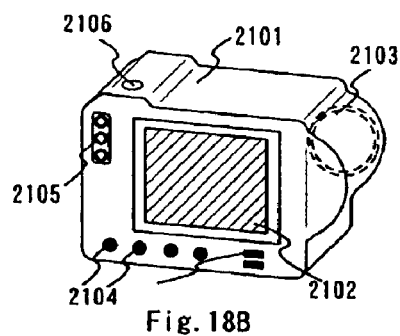

FIG. 18B illustrates a digital still camera which includes a main body 2101, a display portion 2102, an image receiving portion 2103, an operation key 2104, an external connection port 2105, a shutter 2106, or the like. The digital still camera of the present invention is completed by use of the light-emitting device of the invention to its display portion 2102.

Figure 18C:
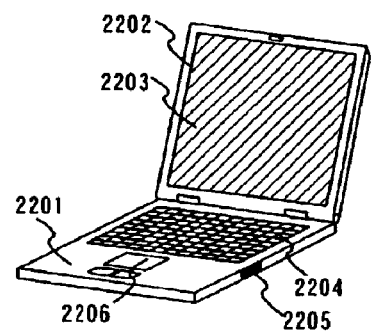

FIG. 18C illustrates a lap-top computer which includes a main body 2201, a casing 2202, a display portion 2203, a keyboard 2204, an external connection port 2205, a pointing mouse 2206, or the like. The lap-top computer of the present invention is completed by use of the light-emitting device of the invention to its display portion 2203.

Figure 18D:
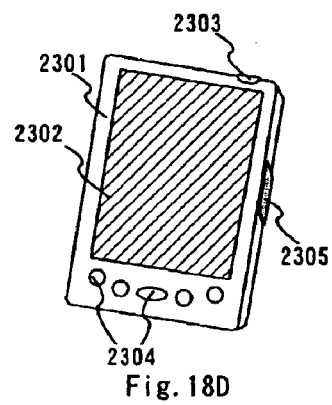

FIG. 18D illustrated a mobile computer which includes a main body 2301, a display portion 2302, a switch 2303, an operation key 2304, an infrared port 2305, or the like. The mobile computer of the present invention is completed by use of the light-emitting device of the invention to its display portion 2302.

Figure 18E:
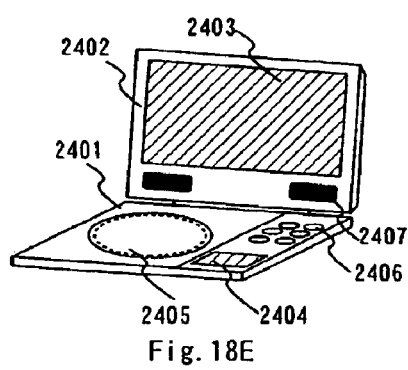

FIG. 18E illustrates a portable image reproducing device including a recording medium (more specifically, a DVD reproduction device), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. In addition, the image reproduction device including a recording medium further includes a game machine or the like. The portable image reproducing device of the present invention is completed by use of the light-emitting device of the invention to these display portions A 3403 and B 3404.

Figure 18F:
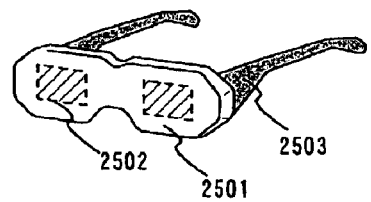

FIG. 18F illustrates a goggle type display (head mounted display) which includes a main body 2501, a display portion 2502, arm portion 2503 or the like. The goggle type display of the present invention is completed by use of the light-emitting device of the invention to its display portion 3502.

Figure 18G:
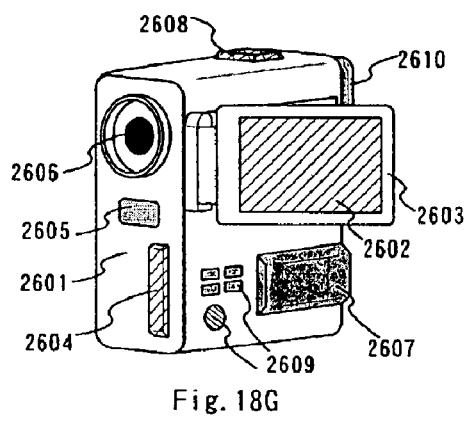

FIG. 18G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, an eyepiece 2610, or the like. The video camera of the present invention is completed by use of the light-emitting device of the invention to its display portion 3602.

Figure 18H:
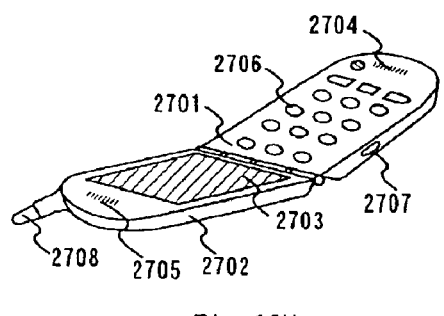
Figure 19:
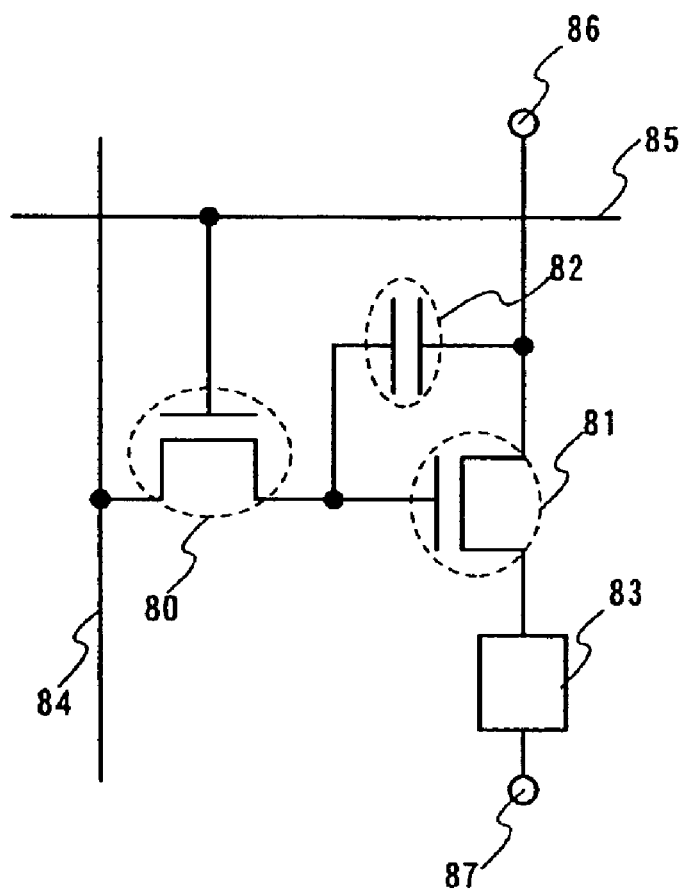
FIG. 19 is a circuit diagram of a pixel of a conventional light-emitting device.

FIG. 18H illustrates a mobile phone which includes a main body 2701, a casing 2702, a display portion 2703, a sound input portion 2704, a sound output portion 2705, an operation key 2706, an external connecting port 2707, an antenna 2708, or the like. Note that the display portion 2703 can reduce power consumption of the mobile telephone by displaying white-colored characters on a black-colored background. The mobile phone of the present invention is completed by use of the light-emitting device of the invention to its display portion 2703.

When a brighter luminance of light emitted from an organic electric field light-emitting material becomes available in the future, the light-emitting device can be used in front or rear projectors by enlarging outputted light that contains image information through a lens or the like and projecting the light.

The aforementioned electronic apparatuses are more likely to be used for display information distributed through a telecommunication path such as Internet, a CATV (cable television system), and in particular likely to display moving picture information. The light-emitting device is suitable for displaying moving pictures since the organic light-emitting material can exhibit high response speed.

A portion of the light-emitting device that is emitting light consumes power, so it is desirable to display information in such a manner that the light-emitting portion therein becomes as small as possible. Accordingly, when the light-emitting device is applied to a display portion which mainly displays character information, e.g., a display portion of a portable information terminal, and more particular, a portable telephone or a sound reproduction device, it is desirable to drive the light-emitting device so that the character information is formed by a light-emitting portion while a non-emission portion corresponds to the background.

As set forth above, the present invention can be applied variously to a wide range of electronic apparatuses in all fields. The electronic apparatuses in this example can be obtained by utilizing the constructions of a light-emitting device shown in First to Sixth Examples.

Figure 20B:
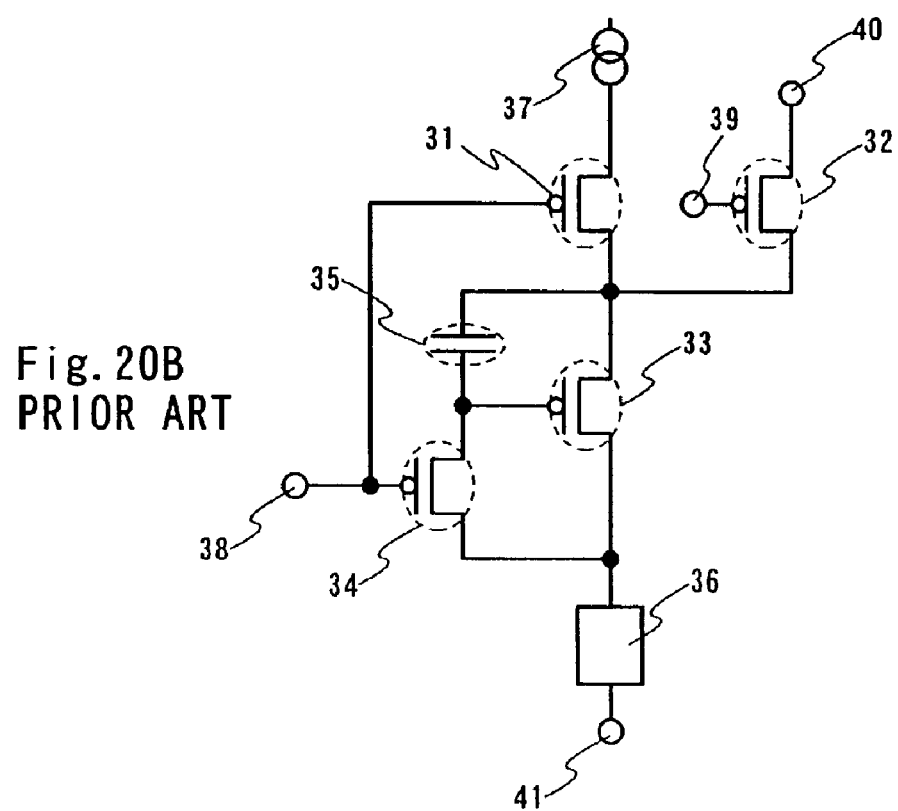
Figure 21:
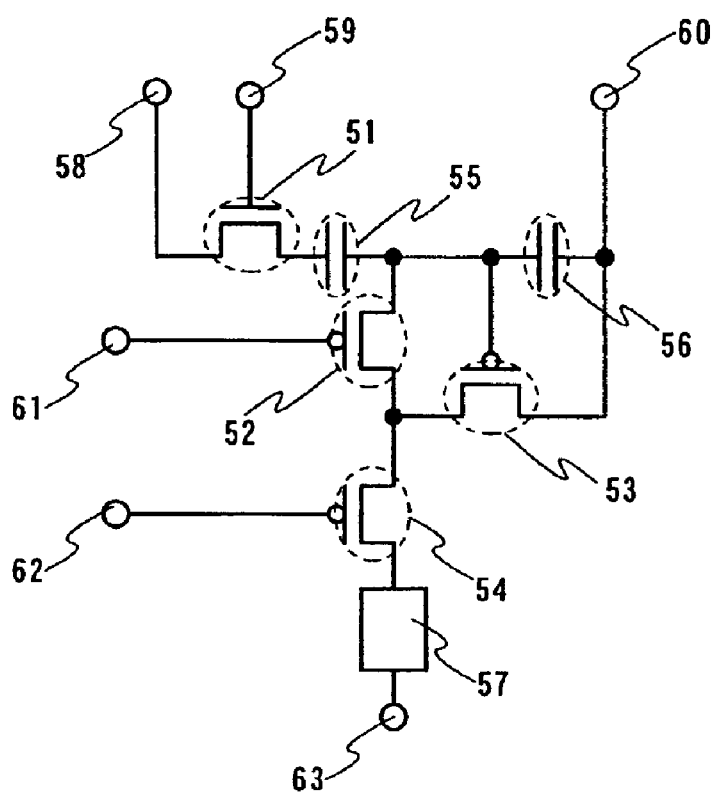
FIG. 21 is a circuit diagram of a pixel of the conventional light-emitting device.

Since a current can be converted to a voltage without feeding a current to a light-emitting element with this construction, the writing time can be suppressed more than that of the pixel shown in FIG. 20B. A single multi-terminal transistor can convert a current supplied to a pixel to a voltage, can retain the voltage and feed the amount of a current corresponding to the amount of the retained voltage. Therefore, unlike the pixel shown in FIG. 20A, the variations in intensity of the light-emitting elements of pixels can be prevented.

The ratio (L/W) of the channel length and channel width between two nodes (first node and second node) for converting a current corresponding to a given video signal to a voltage is smaller than L/W between two nodes (third and fourth nodes) for converting the voltage to a current again and supplying the current to the light-emitting element. In other words, the channel length between two nodes for converting a current corresponding to a given video signal to a voltage is made shorter than the channel length between two nodes for converting the voltage to a current again and supplying the current to the light-emitting element.

As the channel width increases, the On-current can be increased. As the channel length increases, the linear characteristic of the saturated region can be increased.

Therefore, with the construction, the writing time can be suppressed, and, at the same time, a desired magnitude of a current can be supplied to a light-emitting element. Thus, the linear characteristic of the saturated region can be increased when the light-emitting element is caused to emit light. As a result, the variations in intensity among pixels can be suppressed.

Furthermore, the threshold-value-corrected, voltage-input light-emitting device according to the invention shorts two nodes of four nodes of a multi-terminal transistor to write the threshold value voltage into a storage capacitor and the amount of voltage corresponding to a given video signal into a storage capacitor. Next, two nodes different from the above-described nodes are shorted, and the two voltages are converted to a current, which is then supplied to the light-emitting element.

What is claimed is:

1. A light-emitting device, comprising:
   means for controlling the connections of first to fourth nodes by controlling a voltage of the gate;
   means for retaining the voltage of the gate;
   means for controlling the connection between the first node and the gate;
   means for controlling a current flowing between the first node and the second node;
   means for controlling a current flowing between the third node and the fourth node; and
   a light-emitting element to which the current flowing between the third node and the fourth node is supplied.

2. A light-emitting device, comprising:
   means for controlling the connections of first to fourth nodes by controlling a voltage of the gate;
   means for retaining the voltage of the gate;
   means for controlling the connection between the second node and the gate;
   means for controlling the magnitude of a voltage retained in the means for retaining a voltage of the gate when the first node and the gate are connected,
   means for controlling a current flowing between the third node and the fourth node; and
   a light-emitting element to which the current flowing between the third node 25 and the fourth node is supplied.

3. An element board, comprising:
   means for controlling the connections of first to fourth nodes by controlling a voltage of the gate;
   means for retaining the voltage of the gate;
   means for controlling the connection between the first node and the gate;
   means for controlling a current flowing between the first node and the second node;
   means for controlling a current flowing between the third node and the fourth node; and
   means for supplying the current flowing between the third node and the fourth node to a light-emitting element.

4. An element board, comprising:
   means for controlling the connections of first to fourth nodes by controlling a voltage of the gate;
   means for retaining the voltage of the gate;
   means for controlling the connection between the second node and the gate;
   means for controlling the magnitude of a voltage retained in the means for retaining a voltage of the gate when the first node and the gate are connected;
   means for controlling a current flowing between the third node and the fourth node; and
   means for supplying the current flowing between the third node and the fourth node to a light-emitting element.

5. A light-emitting device according to claim 1, wherein the light-emitting device is incorporated into an electronic apparatus selected from the group consisting of an a video camera, a digital camera, a goggles-type display, a navigation system, a sound reproduction device, a lap-top computer, a game machine, a portable information terminal, and an image reproduction device including a recording medium.

6. A light-emitting device according to claim 2, wherein the light-emitting device is incorporated into an electronic apparatus selected from the group consisting of an a video camera, a digital camera, a goggles-type display, a navigation system, a sound reproduction device, a lap-top computer, a game machine, a portable information terminal, and an image reproduction device including a recording medium.

7. An element board according to claim 3, wherein the element board is incorporated into an electronic apparatus selected from the group consisting of an a video camera, a digital camera, a goggles-type display, a navigation system, a sound reproduction device, a lap-top computer, a game machine, a portable information terminal, and an image reproduction device including a recording medium.

8. An element board according to claim 4, wherein the element board is incorporated into an electronic apparatus selected from the group consisting of an a video camera, a digital camera, a goggles-type display, a navigation system, a sound reproduction device, a lap-top computer, a game machine, a portable information terminal, and an image reproduction device including a recording medium.

9. A light-emitting device, comprising:
   a transistor having a gate and first to fourth nodes and controlling the connections of the first to fourth nodes by controlling a voltage of the gate;
   a capacitor for retaining the voltage of the gate;
   a transistor for controlling the connection between the first node and the gate;
   a transistor for controlling a current flowing between the first node and the second node;
   a transistor for controlling a current flowing between the third node and the fourth node; and
   a light-emitting element to which the current flowing between the third node and the fourth node is supplied.

10. A light-emitting display device comprising:
    a first transistor having a gate and first to fourth nodes and controlling the connections of the first to fourth nodes by controlling a voltage of the gate;
    a capacitor for retaining the voltage of the gate;
    a second transistor for controlling the connection between the first node and the gate;
    third and forth transistors for controlling a current flowing between the first node and the second node;
    fifth and sixth transistors for controlling a current flowing between the third node and the fourth node; and
    a light-emitting element to which the current flowing between the third node and the fourth node is supplied.

11. A light-emitting device according to claim 10, wherein the light-emitting device is incorporated into an electronic apparatus selected from the group consisting of an a video camera, a digital camera, a goggles-type display, a navigation system, a sound reproduction device, a lap-top computer, a game machine, a portable information terminal, and an image reproduction device including a recording medium.

12. A light-emitting device according to claim 9, wherein the light-emitting device is incorporated into an electronic apparatus selected from the group consisting of an a video camera, a digital camera, a goggles-type display, a navigation system, a sound reproduction device, a lap-top computer, a game machine, a portable information terminal, and an image reproduction device including a recording medium.

* * * * *